(12) United States Patent
Fujii et al.

(10) Patent No.: US 12,105,425 B2
(45) Date of Patent: Oct. 1, 2024

(54) EXPOSURE METHOD, EXPOSURE SYSTEM, AND METHOD FOR MANUFACTURING ELECTRONIC DEVICES

(71) Applicant: Gigaphoton Inc., Tochigi (JP)

(72) Inventors: Koichi Fujii, Oyama (JP); Osamu Wakabayashi, Oyama (JP); Toshihiro Oga, Oyama (JP)

(73) Assignee: Gigaphoton Inc., Tochigi (JP)

( * ) Notice: Subject to any disclaimer, the term of this patent is extended or adjusted under 35 U.S.C. 154(b) by 115 days.

(21) Appl. No.: 17/818,174

(22) Filed: Aug. 8, 2022

(65) Prior Publication Data
US 2022/0390851 A1    Dec. 8, 2022

Related U.S. Application Data

(63) Continuation of application No. PCT/JP2020/012544, filed on Mar. 19, 2020.

(51) Int. Cl.
G03F 7/20 (2006.01)
G03F 7/00 (2006.01)

(52) U.S. Cl.
CPC ...... *G03F 7/70025* (2013.01); *G03F 7/70041* (2013.01); *G03F 7/70866* (2013.01)

(58) Field of Classification Search
CPC ............ G03F 7/70025; G03F 7/70041; G03F 7/70866; G03F 7/70558; G03F 7/70575; G03F 7/20; H01S 3/0809; H01S 3/10069; H01S 3/131; H01S 3/2251;
(Continued)

(56) References Cited

U.S. PATENT DOCUMENTS

2015/0070673 A1*  3/2015  Lalovic ............... G03F 7/70041
355/67

FOREIGN PATENT DOCUMENTS

| JP | H03-089512 A | 4/1991 |
| JP | H04-307922 A | 10/1992 |
| JP | H07-142805 A | 6/1995 |

(Continued)

OTHER PUBLICATIONS

Lalovic, Ivan et al.; RELAX: Resolution Enhancement by Laser-Spectrum Adjusted Exposure; Optical Microlithography XVIII; Proceedings of SPIE—The International Society for Optical Engineering; vol. 5754; May 12, 2005; pp. 447-455.

(Continued)

*Primary Examiner* — Mesfin T Asfaw
(74) *Attorney, Agent, or Firm* — Studebaker & Brackett PC

(57) ABSTRACT

An exposure method includes reading data representing a relationship between a first parameter relating to an energy ratio between energy of first pulsed laser light having a first wavelength and energy of second pulsed laser light having a second wavelength longer than the first wavelength and a second parameter relating to a sidewall angle of a resist film that is the angle of a sidewall produced when the resist film is exposed to the first pulsed laser light and the second pulsed laser light, and determining a target value of the first parameter and a target value of the second parameter based on the data and a target value of the second parameter; and exposing the resist film to the first pulsed laser light and the second pulsed laser light by controlling a narrowed-line gas laser apparatus to output the first pulsed laser light and the second pulsed laser light based on the target value of the first parameter.

20 Claims, 21 Drawing Sheets

(58) Field of Classification Search
CPC .... H01S 3/08009; H01S 3/1305; H01S 3/134; H01S 3/136; H01S 3/137; H01S 3/139
See application file for complete search history.

(56) References Cited

FOREIGN PATENT DOCUMENTS

| | | |
|---|---|---|
| JP | 2007-012970 A | 1/2007 |
| JP | 2007-511074 A | 4/2007 |
| JP | 2011-022529 A | 2/2011 |
| JP | 2018-054992 A | 4/2018 |
| WO | 2005/046011 A2 | 5/2005 |
| WO | 2019/079010 A1 | 4/2019 |

OTHER PUBLICATIONS

International Preliminary Report on Patentability (Chapter I) and Written Opinion of the International Searching Authority issued in PCT/JP2020/012544; issued Sep. 20, 2022.
International Search Report issued in PCT/JP2020/012544; mailed Jun. 16, 2020.

* cited by examiner

FIG. 3A
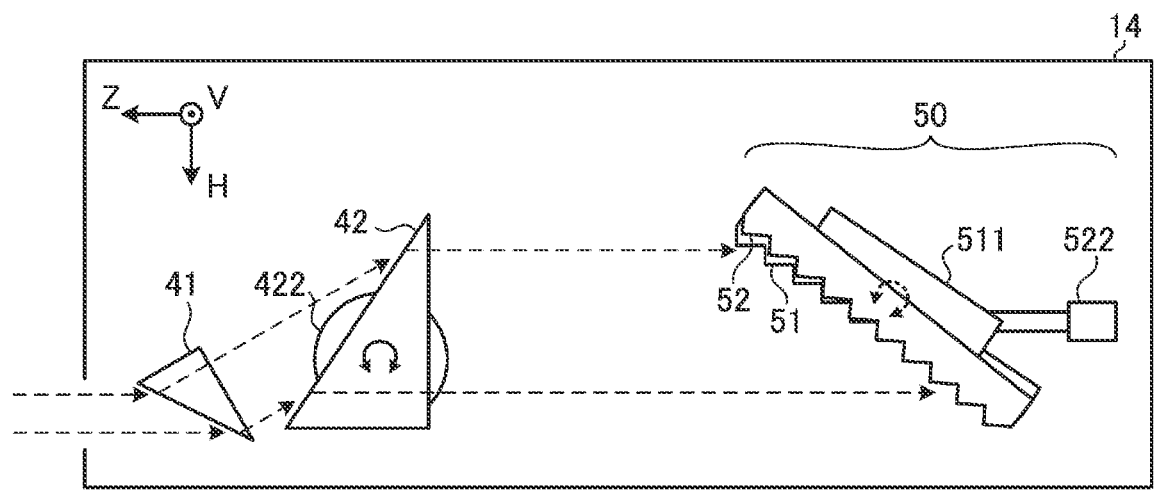
FIG. 3B
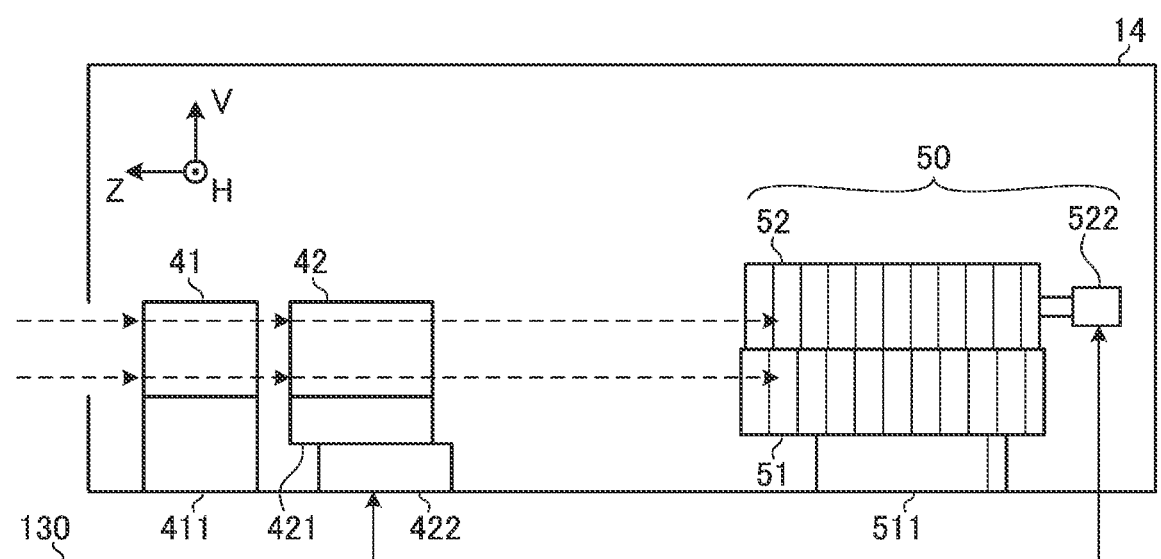
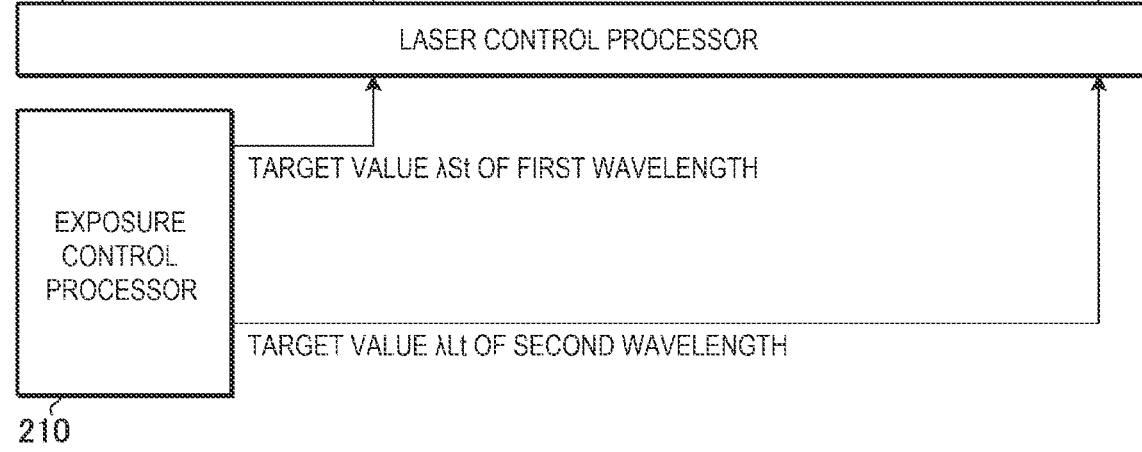

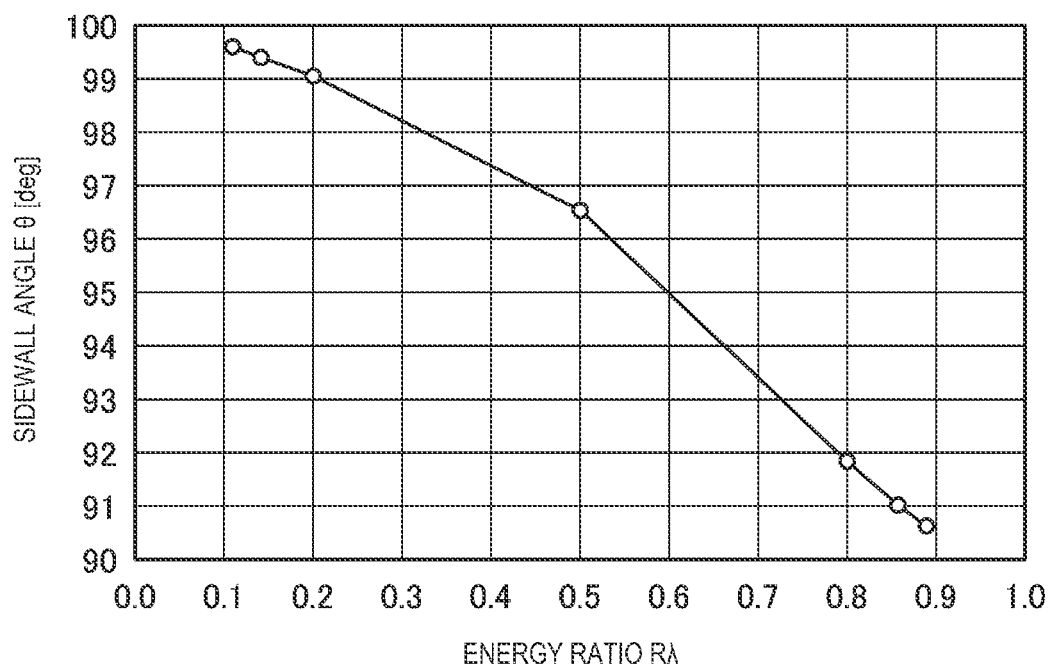

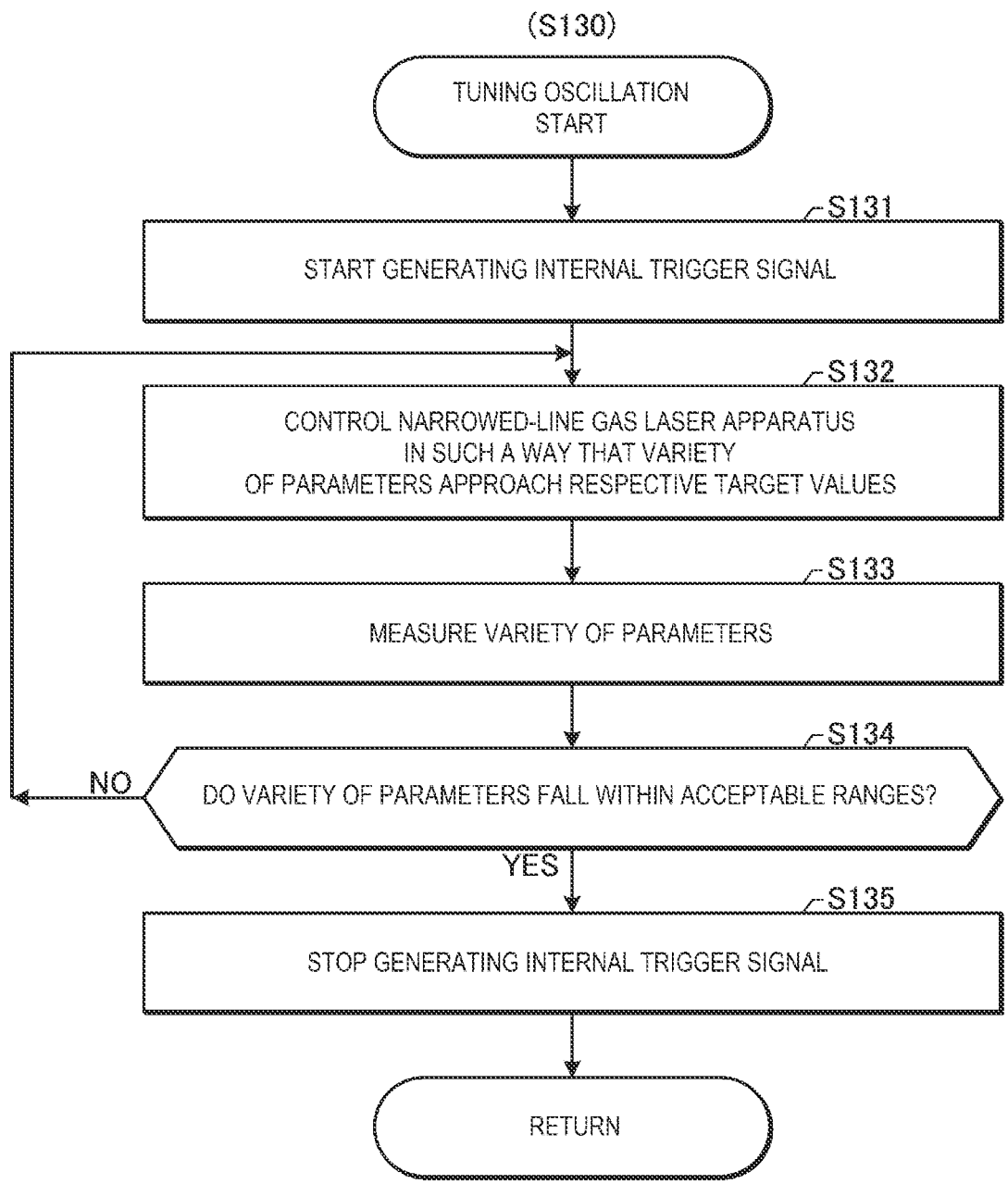

FIG. 20

| NAME OF RESIST MATERIAL | ... | | | | |
|---|---|---|---|---|---|
| THICKNESS OF RESIST | ... | | | | |
| EXPOSURE CONDITIONS | ... | | | | |
| | VARIETY OF PARAMETERS | | | | |
| No. | FIRST WAVELENGTH λS | SECOND WAVELENGTH λL | ENERGY RATIO RA | PULSE ENERGY E | SIDEWALL ANGLE θ |
| 1 | ... | ... | ... | ... | ... |
| 2 | ... | ... | ... | ... | ... |
| 3 | ... | ... | ... | ... | ... |
| 4 | ... | ... | ... | ... | ... |
| 5 | | | | | |
| ... | | | | | |

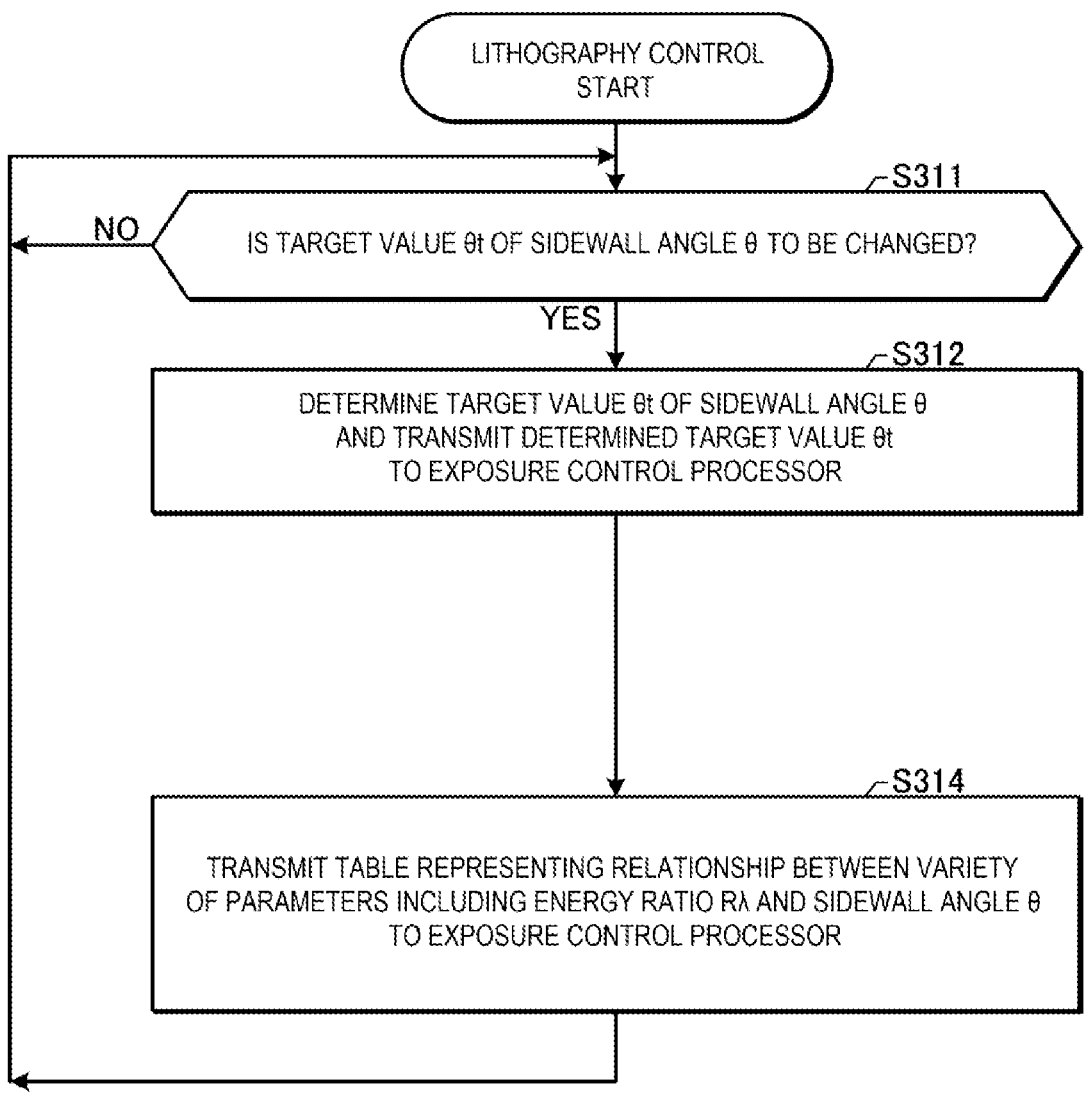

EXPOSURE METHOD, EXPOSURE SYSTEM, AND METHOD FOR MANUFACTURING ELECTRONIC DEVICES

CROSS-REFERENCE TO RELATED APPLICATIONS

The present application is a continuation application of International Application No. PCT/JP2020/012544, filed on Mar. 19, 2020, the entire contents of which are hereby incorporated by reference.

BACKGROUND

1. Technical Field

The present disclosure relates to an exposure method, an exposure system, and a method for manufacturing electronic devices.

2. Related Art

In recent years, a semiconductor exposure apparatus is required to improve the resolution thereof as semiconductor integrated circuits are increasingly miniaturized and highly integrated. To this end, reduction in the wavelength of light outputted from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

The light from spontaneously oscillating KrF and ArF excimer laser apparatuses has a wide spectral linewidth ranging from 350 to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light outputted from the gas laser apparatus needs to be narrow enough to make the chromatic aberrations negligible. To this end, a line narrowing module (LNM) including a line narrowing element (such as etalon and grating) is provided in a laser resonator of the gas laser apparatus to narrow the spectral linewidth in some cases. A gas laser apparatus providing a narrowed spectral linewidth is hereinafter referred to as a narrowed-line gas laser apparatus.

CITATION LIST

Patent Literature

[PTL 1] JP-A-2018-054992
[PTL 2] WO 2019/079010

SUMMARY

An exposure method according to a viewpoint of the present disclosure includes reading data representing a relationship between a first parameter relating to an energy ratio between energy of first pulsed laser light having a first wavelength and energy of second pulsed laser light having a second wavelength longer than the first wavelength and a second parameter relating to a sidewall angle of a resist film that is an angle of a sidewall produced when the resist film is exposed to the first pulsed laser light and the second pulsed laser light, and determining a target value of the first parameter based on the data and a target value of the second parameter; and exposing the resist film to the first pulsed laser light and the second pulsed laser light by controlling a narrowed-line gas laser apparatus to output the first pulsed laser light and the second pulsed laser light based on the target value of the first parameter.

An exposure system according to another viewpoint of the present disclosure includes a processor configured to read data representing a relationship between a first parameter relating to an energy ratio between energy of first pulsed laser light having a first wavelength and energy of second pulsed laser light having a second wavelength longer than the first wavelength and a second parameter relating to a sidewall angle of a resist film that is an angle of a sidewall produced when the resist film is exposed to the first pulsed laser light and the second pulsed laser light, and determine a target value of the first parameter based on the data and a target value of the second parameter; a narrowed-line gas laser apparatus configured to output the first pulsed laser light and the second pulsed laser light based on the target value of the first parameter; and an exposure apparatus configured to expose the resist film to the first pulsed laser light and the second pulsed laser light outputted from the narrowed-line gas laser apparatus.

A method for manufacturing electronic devices according to another viewpoint of the present disclosure includes reading data representing a relationship between a first parameter relating to an energy ratio between energy of first pulsed laser light having a first wavelength and energy of second pulsed laser light having a second wavelength longer than the first wavelength and a second parameter relating to a sidewall angle of a resist film that is an angle of a sidewall produced when the resist film is exposed to the first pulsed laser light and the second pulsed laser light, and determining a target value of the first parameter based on the data and a target value of the second parameter; controlling a narrowed-line gas laser apparatus to output the first pulsed laser light and the second pulsed laser light to an exposure apparatus based on the target value of the first parameter; and exposing the resist film to the first pulsed laser light and the second pulsed laser light in the exposure apparatus to manufacture the electronic devices.

BRIEF DESCRIPTION OF THE DRAWINGS

Embodiments of the present disclosure will be described below only by way of example with reference to the accompanying drawings.

FIGS. 3A and 3B schematically show the configuration of a line narrowing apparatus in Comparative Example.

FIG. 10 is a graph showing an example of the relationship of an energy ratio Rλ between the energy of a wavelength component having a first wavelength λS and the energy of a wavelength component having a second wavelength with the sidewall angle θ of the resist film.

FIG. 11 is a table showing the example of the relationship of the energy ratio Rλ between the energy of the wavelength component having the first wavelength λS and the energy of the wavelength component having the second wavelength with the sidewall angle θ of the resist film.

FIG. 14 is a flowchart showing the procedure in accordance with which tuning oscillation is performed.

FIG. 20 shows an example of a table stored in a memory of a lithography control processor.

FIG. 22 is a flowchart showing the procedure in accordance with which the lithography control processor performs lithography control.

DETAILED DESCRIPTION

Figure 1:
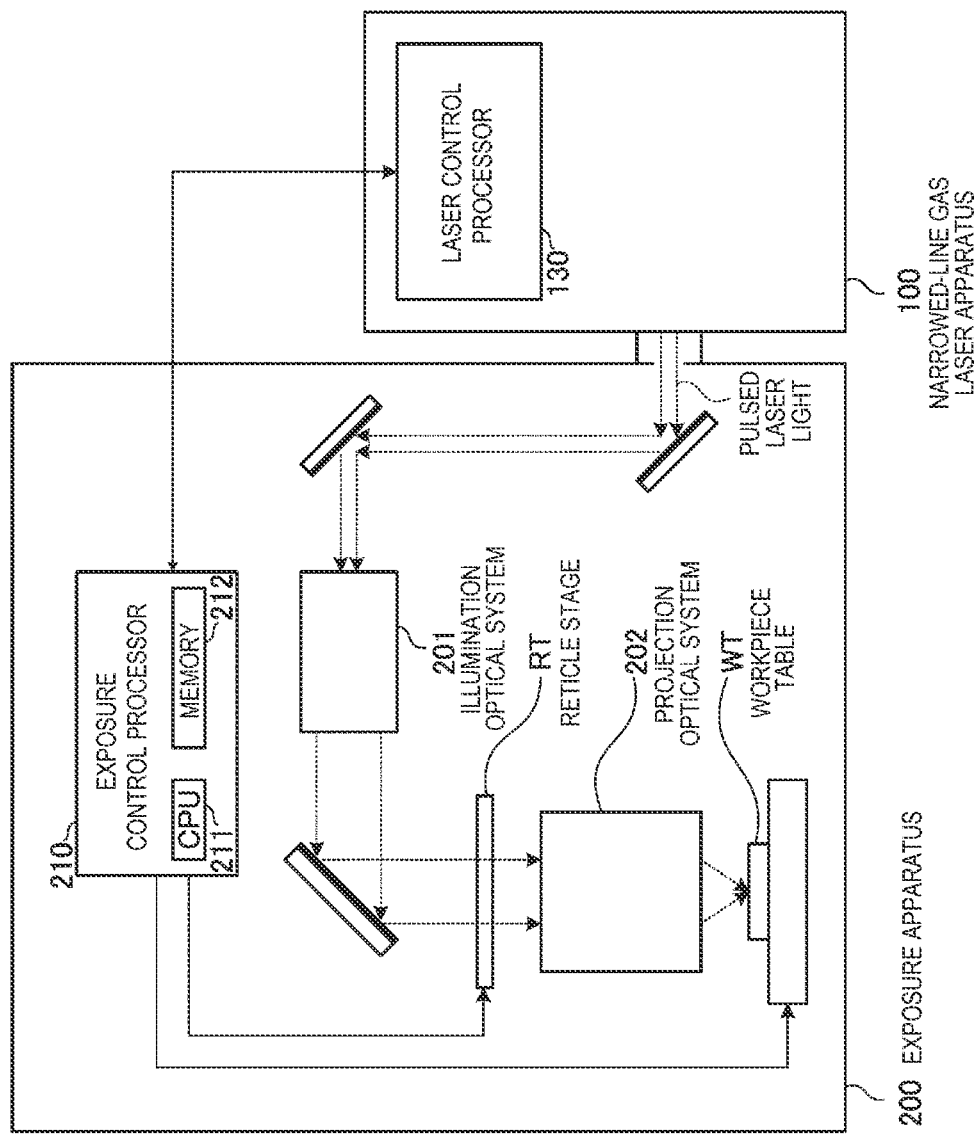
FIG. 1 schematically shows the configuration of an exposure system according to Comparative Example.

<Contents>
1. Comparative Example
1.1 Exposure system
1.1.1 Configuration of exposure apparatus 200
1.1.2 Operation
1.2 Narrowed-line gas laser apparatus
1.2.1 Configuration
1.2.1.1 Master oscillator MO
1.2.1.2 Laser control processor 130
1.2.1.3 Gas regulator GA
1.2.2 Operation
1.2.2.1 Laser control processor 130
1.2.2.2 Master oscillator MO
1.2.2.3 Gas regulator GA
1.3 Line narrowing apparatus
1.3.1 Configuration
1.3.1.1 First prism 41 and second prism 42
1.3.1.2 Grating system 50
1.3.2 Operation
1.3.3 Problems with Comparative Example
2. Exposure system that determines target value Rλt of energy ratio Rλ based on target value θt of sidewall angle θ
2.1 Configuration
2.2 Operation
2.3 Energy ratio and sidewall angle
2.3.1 Example of second parameter for sidewall angle
2.3.2 Example of first parameter for the energy ratio
2.3.3 Relationship between first and second parameters
2.4 Operation of exposure control processor 210
2.5 Operation of laser control processor 130
2.6 Other configuration examples
2.7 Effects
3. Exposure system that performs wavelength switching on a pulse basis
3.1 Configuration
3.2 Operation of narrowed-line gas laser apparatus 100
3.3 Operation of laser control processor 130
3.4 Other configuration examples
3.5 Effects
4. Exposure system including resist film inspection apparatus 701
4.1 Configuration
4.2 Operation of lithography control processor 310
4.3 Other configuration examples
4.4 Effects
5. Line narrowing apparatus that selects three or more wavelengths
5.1 Configuration
5.1.1 Plane parallel substrates 61 and 65
5.1.2 Gratings 51 to 53
5.2 Operation of narrowed-line gas laser apparatus 100
5.3 Relationship between energy ratio Rλ and sidewall angle θ
5.4 Operation of lithography control processor 310
5.5 Other configuration examples
5.6 Effects
6. Others Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. COMPARATIVE EXAMPLE

1.1 Exposure System

Figure 2:
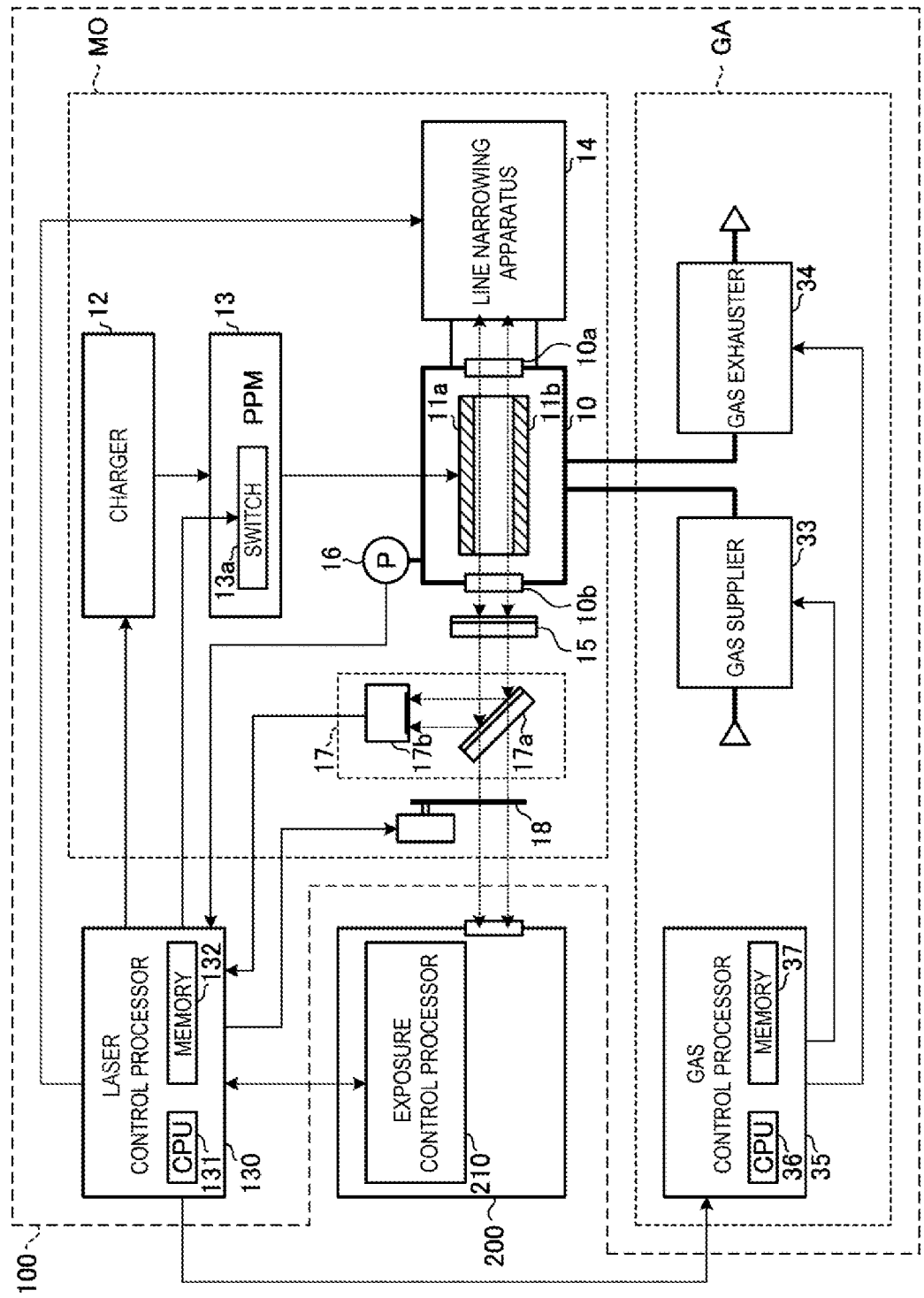
FIG. 2 schematically shows the configuration of the exposure system according to Comparative Example.

FIGS. 1 and 2 schematically show the configuration of an exposure system according to Comparative Example. Comparative Example in the present disclosure is an aspect that the applicant is aware of is known only by the applicant, and is not a publicly known example that the applicant is self-aware of.

The exposure system includes a narrowed-line gas laser apparatus 100 and an exposure apparatus 200. FIG. 1 shows the narrowed-line gas laser apparatus 100 in a simplified form. FIG. 2 shows the exposure apparatus 200 in a simplified form.

The narrowed-line gas laser apparatus 100 includes a laser control processor 130. The narrowed-line gas laser apparatus 100 outputs pulsed laser light toward the exposure apparatus 200.

1.1.1 Configuration of Exposure Apparatus 200

The exposure apparatus 200 includes an illumination optical system 201, a projection optical system 202, and an exposure control processor 210, as shown in FIG. 1. The exposure apparatus 200 corresponds to the external apparatus in the present disclosure.

The illumination optical system 201 illuminates a reticle pattern of a reticle that is not shown but is placed on a reticle stage RT with the pulsed laser light having entered the exposure apparatus 200 from the narrowed-line gas laser apparatus 100.

The projection optical system 202 performs reduction projection on the pulsed laser light having passed through the reticle to cause the pulsed laser light to be brought into focus on a workpiece that is not shown but is placed on a workpiece table WT. The workpiece is a light sensitive substrate onto which a resist film has been applied, such as a semiconductor wafer.

The exposure control processor 210 is a processing apparatus including a memory 212, which stores a control program, and a CPU (central processing unit) 211, which executes the control program. The exposure control processor 210 is particularly configured or programmed to carry out a variety of processes contained in the present disclosure. The exposure control processor 210 oversees and controls the exposure apparatus 200 and transmits and receives a variety of data and signals to and from the laser control processor 130.

1.1.2 Operation

The exposure control processor 210 transmits data on a target wavelength value, data on a target pulse energy value, and a trigger signal to the laser control processor 130. The laser control processor 130 controls the narrowed-line gas laser apparatus 100 in accordance with the data and the signal.

The exposure control processor 210 translates the reticle stage RT and the workpiece table WT in opposite directions in synchronization with each other. The workpiece is thus exposed to the pulsed laser light having reflected the reticle pattern.

The exposure step described above causes the reticle pattern to be transferred to the semiconductor wafer. The following multiple steps allow manufacture of electronic devices.

1.2 Narrowed-Line Gas Laser Apparatus

1.2.1 Configuration

The narrowed-line gas laser apparatus 100 includes a master oscillator MO and a gas regulator GA as well as the laser control processor 130, as shown in FIG. 2.

1.2.1.1 Master Oscillator MO

The master oscillator MO includes a laser chamber 10, a charger 12, a pulse power module (PPM) 13, a line narrowing apparatus 14, an output coupling mirror 15, a photodetector 17, and a shutter 18. The line narrowing apparatus 14 and the output coupling mirror 15 form an optical resonator.

The laser chamber 10 is disposed in the optical path of the optical resonator. The laser chamber 10 is provided with windows 10a and 10b.

The laser chamber 10 has a pair of electrodes 11a and 11b provided therein, and also houses a laser gas as a laser medium. The laser medium is, for example, $F_2$, ArF, KrF, XeCl, or XeF.

A pressure sensor 16 is attached to the laser chamber 10.

The charger 12 holds electrical energy to be supplied to the pulse power module 13. The pulse power module 13 includes a switch 13a.

The line narrowing apparatus 14 includes wavelength selectors such as a first prism 41 and a second prism 42, and gratings 51 and 52, which will be described later.

The output coupling mirror 15 is formed of a partial reflection mirror.

The photodetector 17 includes a beam splitter 17a and a sensor unit 17b. The beam splitter 17a is disposed in the optical path of the pulsed laser light having exited via the output coupling mirror 15. The beam splitter 17a transmits a portion of the pulsed laser light at high transmittance and reflects the other portion of the pulsed laser light to enter the sensor unit 17b. The sensor unit 17b includes a spectral sensor and is capable of outputting measured wavelength data. The sensor unit 17b further includes an energy sensor and is capable of outputting measured pulse energy data.

The shutter 18 is disposed in the optical path of the pulsed laser light having passed through the beam splitter 17a. When the shutter 18 is closed, the pulsed laser light having passed through the beam splitter 17a is blocked so as not to enter the exposure apparatus 200. When the shutter 18 is open, the pulsed laser light having passed through the beam splitter 17a is not blocked but enters the exposure apparatus 200.

1.2.1.2 Laser Control Processor 130

The laser control processor 130 is a processing apparatus including a memory 132, which stores a control program, and a CPU 131, which executes the control program. The laser control processor 130 is particularly configured or programmed to perform a variety of processes contained in the present disclosure.

1.2.1.3 Gas Regulator GA

The gas regulator GA includes a gas supplier 33, a gas exhauster 34, and a gas control processor 35.

The gas supplier 33 includes a valve that is not shown but is provided in a first pipe between the laser chamber 10 and a gas cylinder that is not shown.

The gas exhauster 34 includes a valve, a pump, and a detoxifier that are not shown but are provided in a second pipe connected to the laser chamber 10.

The gas control processor 35 is a processing apparatus including a memory 37, which stores a control program, and a CPU 36, which executes the control program. The gas control processor 35 is particularly configured or programmed to perform a variety of processes contained in the present disclosure.

1.2.2 Operation

1.2.2.1 Laser Control Processor 130

The laser control processor 130 acquires the data on a wavelength target value from the exposure control processor 210. The laser control processor 130 transmits an initial setting signal to the line narrowing apparatus 14 based on the wavelength target value. After the narrowed-line gas laser apparatus 100 starts outputting the pulsed laser light, the laser control processor 130 receives the measured wavelength data from the photodetector 17 and transmits a feedback control signal to the line narrowing apparatus 14 based on the wavelength target value and the measured wavelength data.

The laser control processor 130 acquires the data on a pulse energy target value from the exposure control processor 210. The laser control processor 130 transmits an initial setting signal that sets an initial charging voltage to the charger 12 based on the pulse energy target value. After the narrowed-line gas laser apparatus 100 starts outputting the pulsed laser light, the laser control processor 130 receives the measured pulse energy data from the photodetector 17 and transmits a charge voltage feedback control signal to the charger 12 based on the pulse energy target value and the measured pulse energy data.

The laser control processor 130 receives the trigger signal from the exposure control processor 210. The laser control processor 130 transmits an oscillation trigger signal based on the trigger signal to the switch 13a of the pulse power module 13.

The laser control processor 130 transmits a gas control signal to the gas control processor 35. Furthermore, the laser control processor 130 receives data on a gas pressure P measured by the pressure sensor 16 and transmits the data on the measured gas pressure P to the gas control processor 35.

1.2.2.2 Master Oscillator MO

The switch 13a is turned on upon receipt of the oscillation trigger signal from the laser control processor 130. When the switch 13a is turned on, the pulse power module 13 generates pulsed high voltage from the electric energy held by the charger 12. The pulse power module 13 applies the high voltage to the space between the electrodes 11a and 11b.

When the high voltage is applied to the space between the electrodes 11a and 11b, discharge occurs between the electrodes 11a and 11b. The energy of the discharge excites the laser gas in the laser chamber 10, and the excited laser gas transitions to a high energy level. Thereafter, when the excited laser gas transitions to a low energy level, the laser gas emits light having a wavelength according to the difference between the energy levels.

The light generated in the laser chamber 10 exits out of the laser chamber 10 via the windows 10a and 10b. The light having exited via the window 10a enters the line narrowing apparatus 14 as an optical beam. Light at a desired wavelength and therearound that enters the line narrowing apparatus 14 is deflected back by the line narrowing apparatus 14 and returns to the laser chamber 10.

The output coupling mirror 15 transmits and outputs part of the light having exited via the window 10b and reflects the remaining light back to the laser chamber 10.

The light having exited out of the laser chamber 10 thus travels back and forth between the line narrowing apparatus 14 and the output coupling mirror 15. The light is amplified whenever passing through the discharge space between the pair of electrodes 11a and 11b. The light thus having undergone the laser oscillation and the line narrowing operation is outputted as the pulsed laser light via the output coupling mirror 15.

The pulsed laser light outputted from the narrowed-line gas laser apparatus 100 enters the exposure apparatus 200.

1.2.2.3 Gas Regulator GA

The gas control processor 35 controls the gas supplier 33 and the gas exhauster 34 in such a way that the gas pressure P in the laser chamber 10 has a desired value based on the gas control signal received from the laser control processor 130 and the data on the measured gas pressure P.

For example, to raise the gas pressure P in the laser chamber 10, the gas control processor 35 opens the valve provided in the gas supplier 33 in such a way that the laser gas is supplied to the interior of the laser chamber 10. For example, to lower the gas pressure P in the laser chamber 10, the gas control processor 35 opens the valve provided in the gas exhauster 34 in such a way that part of the laser gas in the laser chamber 10 is exhausted.

1.3 Line Narrowing Apparatus

1.3.1 Configuration

FIGS. 3A and 3B schematically show the configuration of the line narrowing apparatus 14 in Comparative Example. V, H, and Z axes, which are perpendicular to each other, are shown in FIGS. 3A and 3B. FIG. 3A shows the line narrowing apparatus 14 viewed in the direction −V, and FIG. 3B shows the line narrowing apparatus 14 viewed in the direction −H. The directions −V and +V coincide with the direction in which the electrodes 11a and 11b (see FIG. 2) face each other. The direction −Z coincides with the traveling direction of the light beam having exited via the window 10a. The direction +Z coincides with the traveling direction of the pulsed laser light having exited via the window 10b and outputted via the output coupling mirror 15.

The line narrowing apparatus 14 includes the first prism 41, the second prism 42, and a grating system 50.

1.3.1.1 First Prism 41 and Second Prism 42

The first prism 41 is disposed in the optical path of the light beam having exited via the window 10a. The first prism 41 is supported by a holder 411.

The second prism 42 is disposed in the optical path of the light beam having passed through the first prism 41. The second prism 42 is supported by a holder 421.

The first prism 41 and the second prism 42 are made of a material having high transmittance for the wavelength selected by the line narrowing apparatus 14, such as calcium fluoride or synthetic quartz.

The first prism 41 and the second prism 42 are so disposed that the surfaces thereof on which the light beam is incident and the via which the light beam exits are all parallel to the axis V. A rotary stage 422 allows the second prism 42 to rotate around an axis parallel to the axis V.

1.3.1.2 Grating System 50

The grating system 50 includes the gratings 51 and 52. The gratings 51 and 52 are disposed in positions different from each other in the direction of the axis V in the optical path of the light beam having passed through the second prism 42. The direction of the grooves in each of the gratings 51 and 52 coincides with the direction of the axis V. The positions of the gratings 51 and 52 are so set that the light beam having passed through the second prism 42 is incident both on the gratings 51 and 52.

The gratings 51 and 52 are supported by a holder 511. It is noted that the grating 51 is supported so as to maintain a fixed posture, whereas the grating 52 is rotatable around an axis parallel to the axis V with the aid of a rotation mechanism 522.

1.3.2 Operation

The light beam having exited via the window 10a is redirected by each of the first prism 41 and the second prism 42 in a plane parallel to the plane HZ, which is a plane perpendicular to the axis V, and the width of the light beam is expanded by the two prisms in the plane parallel to the plane HZ. The traveling direction of the light beam passing through both the first prism 41 and the second prism 42 toward the gratings 51 and 52 substantially coincides with the direction –Z by way of example.

The light incident from the second prism 42 on the gratings 51 and 52 is reflected off and diffracted by a plurality of grooves of the gratings 51 and 52 in the direction corresponding to the wavelength of the light. The light reflected off the plurality of grooves of each of the gratings 51 and 52 is thus dispersed in the plane parallel to the plane HZ. The grating 51 is disposed in the Littrow arrangement, which causes the angle of incidence of the light beam incident from the second prism 42 on the grating 51 to be equal to the angle of diffraction of the diffracted light having a desired first wavelength $\lambda S$. The grating 52 is disposed in the Littrow arrangement, which causes the angle of incidence of the light beam incident from the second prism 42 on the grating 52 to be equal to the angle of diffraction of the diffracted light having a desired second wavelength $\lambda L$. When the angles of incidence of the light beam incident from the second prism 42 on the gratings 51 and 52 differ from each other, a wavelength difference occurs between the first wavelength $\lambda S$ of the diffracted light that returns from the grating 51 back to the second prism 42 and the second wavelength $\lambda L$ of the diffracted light that returns from the grating 52 back to the second prism 42.

In FIGS. 3A and 3B, the broken-line arrows representing the light beam only indicate the direction from the first prism 41 toward the gratings 51 and 52, whereas the light beam having the wavelength selected by the line narrowing apparatus 14 travels from the gratings 51 and 52 toward the first prism 41 in the path in the direction opposite the broken-line arrows.

The second prism 42 and the first prism 41 reduce the beam width of the light having returned from the gratings 51 and 52 in the plane parallel to the plane HZ, and cause the resultant light to return into the laser chamber 10 via the window 10a.

The rotary stage 422 and the rotation mechanism 522 are controlled by the laser control processor 130.

When the rotary stage 422 slightly rotates the second prism 42, the traveling direction of the light beam that exits out of the second prism 42 toward the gratings 51 and 52 slightly changes in the plane parallel to the plane HZ. The angle of incidence of the light beam incident from the second prism 42 on each of the gratings 51 and 52 thus slightly changes. The first wavelength $\lambda S$ and the second wavelength $\lambda L$ therefore both change.

When the rotation mechanism 522 slightly rotates the grating 52, the angle of incidence of the light beam incident from the second prism 42 on the grating 51 does not change, but the angle of incidence of the light beam incident from the second prism 42 on the grating 52 slightly changes. The difference between the first wavelength $\lambda S$ and the second wavelength $\lambda L$ therefore changes.

The exposure control processor 210 transmits a target value $\lambda St$ of the first wavelength $\lambda S$ and a target value $\lambda Lt$ of the second wavelength $\lambda L$ to the laser control processor 130. The target value $\lambda St$ of the first wavelength $\lambda S$ and the target value $\lambda Lt$ of the second wavelength $\lambda L$ are each, for example, the value of a wavelength of light to be brought into focus in two positions of the top and bottom surfaces of the resist film applied onto the semiconductor wafer, respectively.

The laser control processor 130 controls the rotary stage 422 based on the target value $\lambda St$ of the first wavelength $\lambda S$. The rotary stage 422 thus changes the posture of the second prism 42 to adjust the angle of incidence of the light beam incident on the grating 51 (first angle of incidence) and the angle of incidence of the light beam incident on the grating 52 (second angle of incidence).

The laser control processor 130 controls the rotation mechanism 522 based on the target value $\lambda Lt$ of the second wavelength $\lambda L$. The rotation mechanism 522 thus changes the posture of the grating 52 to adjust the second angle of incidence of the light beam incident on the grating 52.

The configurations and operations described above select the light beam having exited via the window 10a of the laser chamber 10 and having the first wavelength $\lambda S$ and the second wavelength $\lambda L$ and cause the selected light to return into the laser chamber 10. The narrowed-line gas laser apparatus 100 can thus perform two-wavelength oscillation. Controlling the rotary stage 422 and the rotation mechanism 522 also allows the first wavelength $\lambda S$ and the second wavelength $\lambda L$ to be separately set.

The pulsed laser light outputted from the narrowed-line gas laser apparatus 100 performing the two-wavelength oscillation contains two wavelength components having the first wavelength $\lambda S$ and the second wavelength $\lambda L$. The pulsed laser light contains pulses resulting from the situation in which the first pulsed laser light having the first wavelength $\lambda S$ and the second pulsed laser light having the second wavelength $\lambda L$ that temporally and spatially coincide with each other. Instead, the first pulsed laser light having the first wavelength $\lambda S$ and the second pulsed laser light having the second wavelength $\lambda L$ may temporally coincide with each other but may not spatially coincide with each other.

The focal length in the exposure apparatus 200 (see FIG. 1) depends on the wavelength of the pulsed laser light. The pulsed laser light outputted from the narrowed-line gas laser apparatus 100 performing the two-wavelength oscillation can be brought into focus in the two different positions in the direction of the optical path axis of the pulsed laser light at the workpiece table WT of the exposure apparatus 200, whereby the depth of focus can be substantially increased. For example, even when a resist film having a large thickness is exposed to the pulsed laser light, the imaging performance can be maintained in the thickness direction of the resist film.

1.3.3 Problems with Comparative Example

In Comparative Example, although the first wavelength $\lambda S$ and the second wavelength can be separately set, it is not easy in some cases to achieve a desired cross-sectional shape of the resist film as a result of exposure and development of the resist film. For example, it is not easy in some cases to cause the sidewall of the resist film, which is the boundary surface between the portion where the resist film is removed by the exposure and development and the portion where the resist film is left on the semiconductor wafer, to have a desired angle with respect to the surface of the semiconductor wafer.

In some embodiments described below, the ratio of the energy at the first wavelength λS and the energy at the second wavelength is determined based on a target value θt of a sidewall angle θ of the resist film. The sidewall angle θ is, for example, the angle of the sidewall of the resist film with respect to the surface of the semiconductor wafer.

2. EXPOSURE SYSTEM THAT DETERMINES TARGET VALUE Rλ T OF ENERGY RATIO Rλ BASED ON TARGET VALUE θT OF SIDEWALL ANGLE θ

2.1 Configuration

Figure 4:
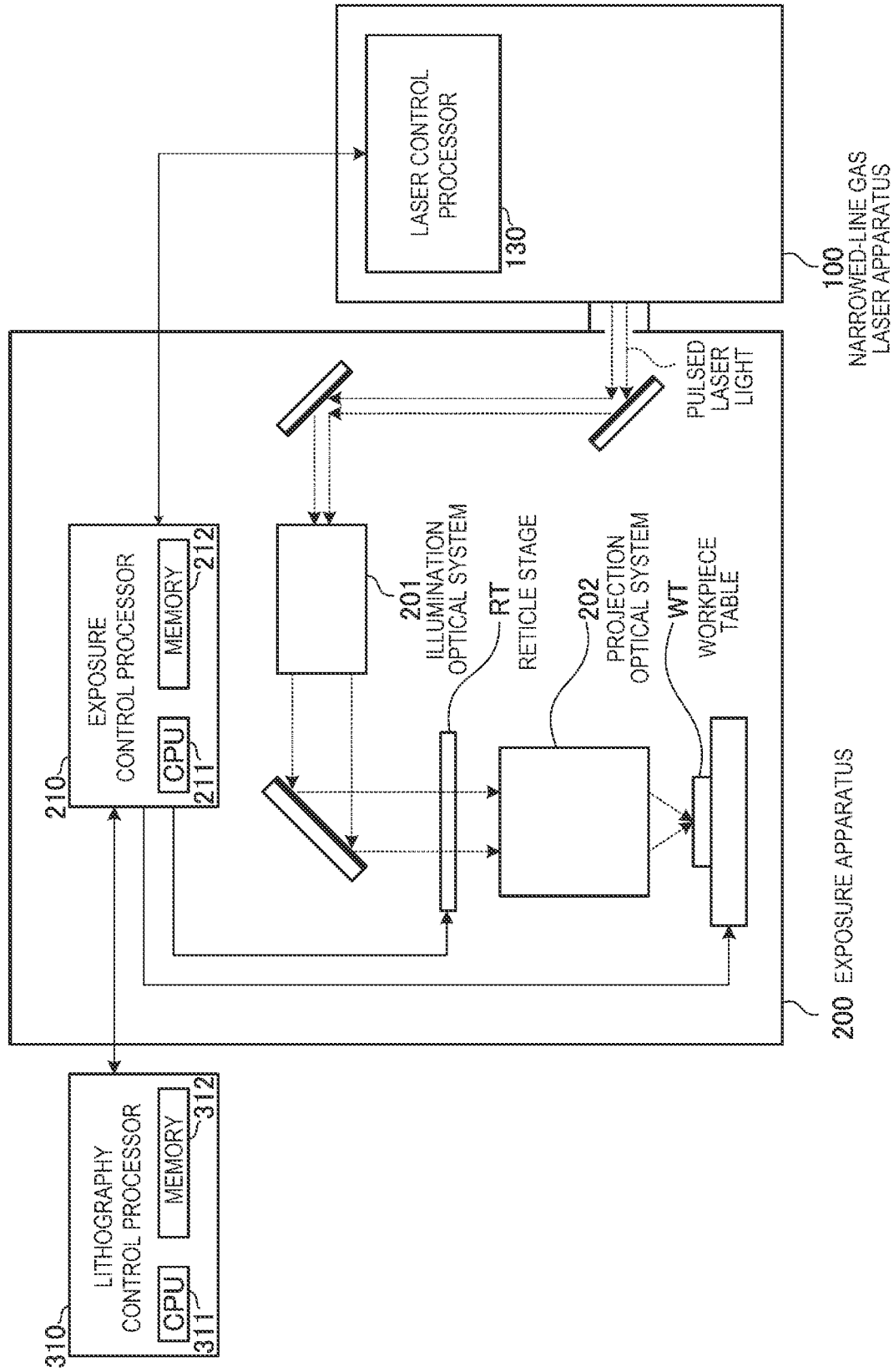
FIG. 4 schematically shows the configuration of an exposure system according to a first embodiment.

FIG. 4 schematically shows the configuration of an exposure system according to a first embodiment. The exposure system includes a lithography control processor 310 as well as the narrowed-line gas laser apparatus 100 and the exposure apparatus 200. The lithography control processor 310 is a processing apparatus including a memory 312, which stores a control program, and a CPU 311, which executes the control program. The lithography control processor 310 is particularly configured or programmed to carry out a variety of processes contained in the present disclosure. The lithography control processor 310 is connected to the exposure control processor 210 and transmits and receives a variety of data and signals to and from the exposure control processor 210. The lithography control processor 310 may be connected to a plurality of exposure control processors 210 provided in a plurality of exposure apparatuses 200 installed in a semiconductor factory.

Figure 5A:
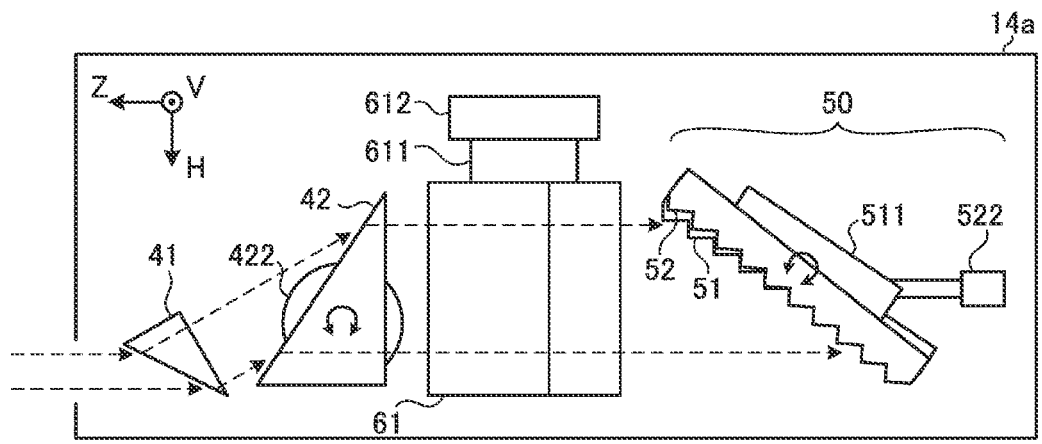
FIGS. 5A and 5B schematically show the configuration of a line narrowing apparatus in the first embodiment.
Figure 5B:
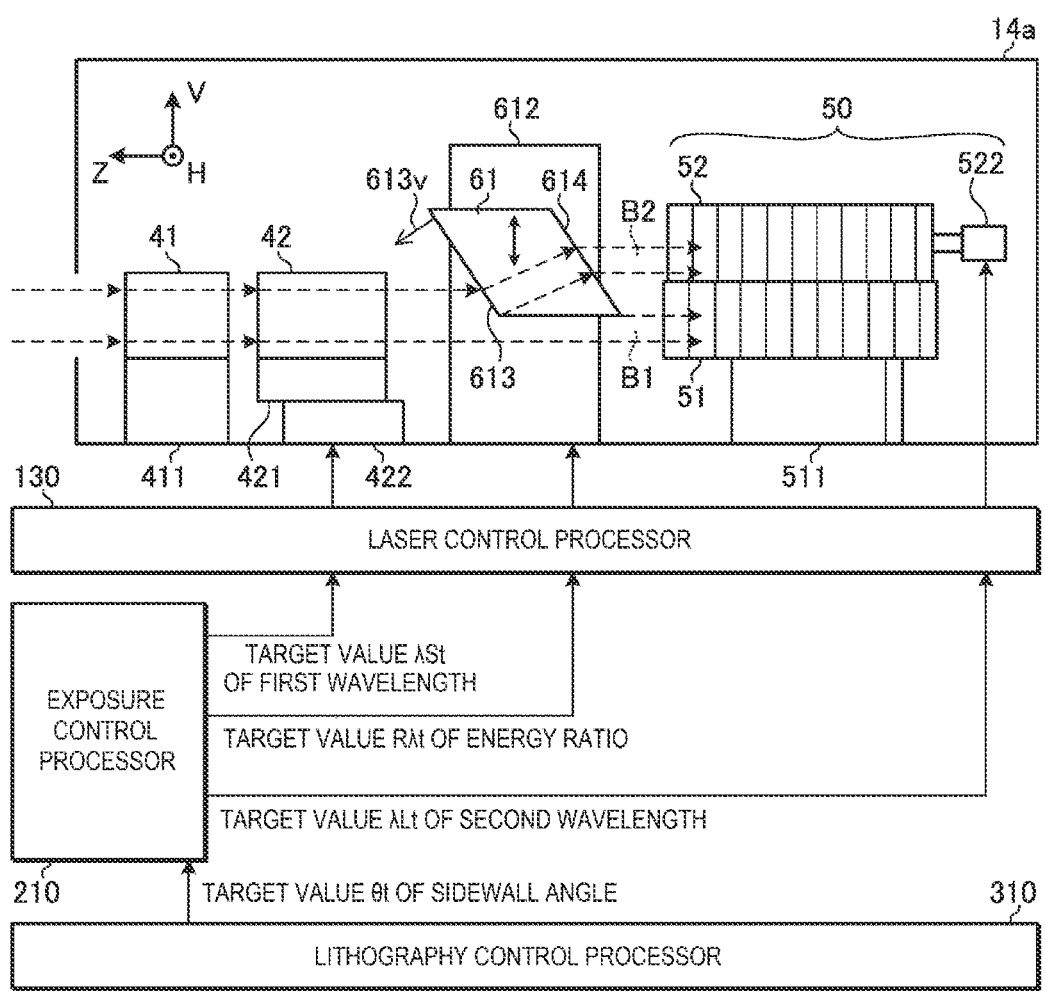

FIGS. 5A and 5B schematically show the configuration of a line narrowing apparatus 14a in the first embodiment. FIG. 5A shows the line narrowing apparatus 14a viewed in the direction −V, and FIG. 5B shows the line narrowing apparatus 14a viewed in the direction −H.

The line narrowing apparatus 14a includes a plane parallel substrate 61.

The plane parallel substrate 61 is disposed so as to overlap with part of the cross-section of the optical path of the light beam having passed through the second prism 42. The plane parallel substrate 61 is disposed in the optical path of the light beam between the second prism 42 and the grating 52. The plane parallel substrate 61 is supported by a holder 611. The plane parallel substrate 61 is made, for example, of calcium fluoride or synthetic quartz. The plane parallel substrate 61 is movable in the directions −V and +V with the aid of a linear stage 612.

The plane parallel substrate 61 has a light incident surface 613, on which part of the light beam having passed through the second prism 42 is incident, and a light exiting surface 614, via which the light incident on the plane parallel substrate 61 via the light incident surface 613 exits out of the interior of the plane parallel substrate 61 toward the grating 52 (see FIG. 5B). The light incident surface 613 and the light exiting surface 614 are both parallel to the axis H and are parallel to each other. The light incident surface 613 and the light exiting surface 614 incline with respect to the direction in which the light beam is incident thereon so as to refract the light beam. Specifically, a normal vector 613v of a normal to the light incident surface 613 is parallel to the plane VZ, and furthermore, the normal vector 613v has directional components in the directions −V and +Z.

2.2 Operation

A first portion B1 of the light beam having passed through the second prism 42 passes through the space outside the plane parallel substrate 61 and is incident on the grating 51. A second portion B2 of the light beam passes through the interior of the plane parallel substrate 61 and is incident on the grating 52. That is, the line narrowing apparatus 14a, which includes the plane parallel substrate 61, causes the first portion B1 of the light beam to be incident on the grating 51 and the second portion B2 of the light beam to be incident on the grating 52. In this process, the plane parallel substrate 61 shifts an optical path axis of the second portion B2 of the light beam in the direction +V with respect to an optical path axis of the first portion B1 of the light beam. The optical path axis refers to the center axis of the optical path. The plane parallel substrate 61 thus transmits a portion of the light beam to adjust the optical path of the portion of the light beam.

The linear stage 612 changes the position of the plane parallel substrate 61 in the direction of the axis V to change the ratio between the first portion B1 and the second portion B2.

Moving the plane parallel substrate 61 in the direction −V increases the second portion B2 of the light beam, the portion entering the plane parallel substrate 61, to increase the light incident on the grating 52. The energy of the wavelength component having the second wavelength contained in the pulsed laser light therefore increases.

Moving the plane parallel substrate 61 in the direction +V decreases the second portion B2 of the light beam, the portion entering the plane parallel substrate 61, to decrease the light incident on the grating 52. The energy of the wavelength component having the second wavelength contained in the pulsed laser light therefore decreases.

The direction in which the linear stage 612 moves the plane parallel substrate 61 may not be the direction of the axis V. The linear stage 612 only needs to move the plane parallel substrate 61 in a direction that intersects with the plane HZ, which is a plane perpendicular to the axis V.

The lithography control processor 310 transmits the target value θt of the sidewall angle θ to the exposure control processor 210.

The exposure control processor 210 determines a target value Rλt of an energy ratio Rλ based on the target value θt of the sidewall angle θ. The determination operation will be described later with reference to FIGS. 6A to 9C.

The exposure control processor 210 transmits the target value λSt of the first wavelength λS, the target value λLt of the second wavelength λL, and the target value Rλt of the energy ratio Rλ to the laser control processor 130.

The laser control processor 130 controls the linear stage 612 based on the target value Rλt of the energy ratio Rλ. The linear stage 612 therefore adjusts the position of the plane parallel substrate 61 to adjust the energy ratio Rλ between the energy of the wavelength component having the first wavelength λS selected by the grating 51 and the energy of the wavelength component having the second wavelength λL selected by the grating 52.

The laser control processor 130 controls the rotary stage 422 based on the target value λSt of the first wavelength λS.

The rotary stage 422 thus changes the posture of the second prism 42 to adjust the first angle of incidence of the first portion B1 of the light beam, the portion incident on the grating 51.

The laser control processor 130 controls the rotation mechanism 522 based on the target value λLt of the second wavelength λL. The rotation mechanism 522 thus changes the posture of the grating 52 to adjust the second angle of incidence of the second portion B2 of the light beam, the portion incident on the grating 52.

2.3 Energy Ratio and Sidewall Angle

Figure 6A:
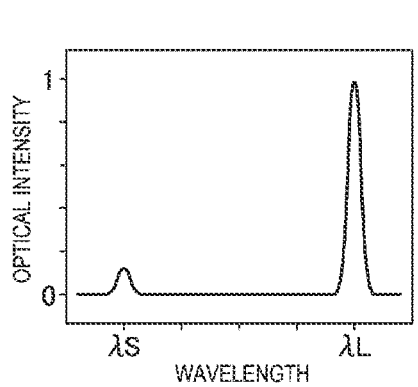
FIG. 6A shows a first example of the spectrum of pulsed laser light outputted from a narrowed-line gas laser apparatus in the first embodiment.
Figure 6B:
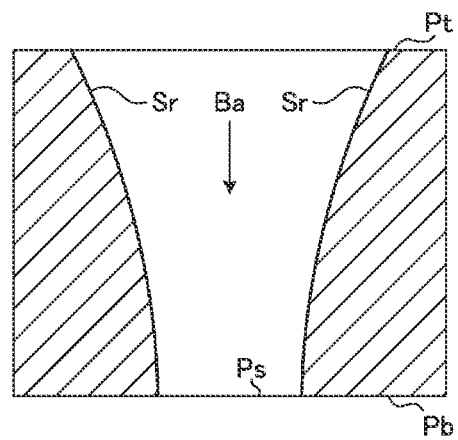
FIG. 6B shows an example of the cross-sectional shape of a resist film produced when the resist film is exposed to the pulsed laser light having the spectrum shown in FIG. 6A.

FIG. 6A shows a first example of the spectrum of the pulsed laser light outputted from the narrowed-line gas laser apparatus 100 in the first embodiment. FIG. 6B shows an example of the cross-sectional shape of the resist film produced when the resist film is exposed to the pulsed laser light having the spectrum shown in FIG. 6A.

Figure 7A:
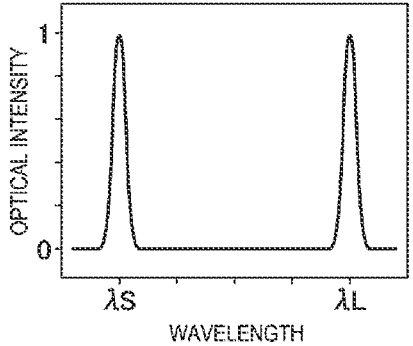
FIG. 7A shows a second example of the spectrum of the pulsed laser light outputted from the narrowed-line gas laser apparatus in the first embodiment.
Figure 7B:
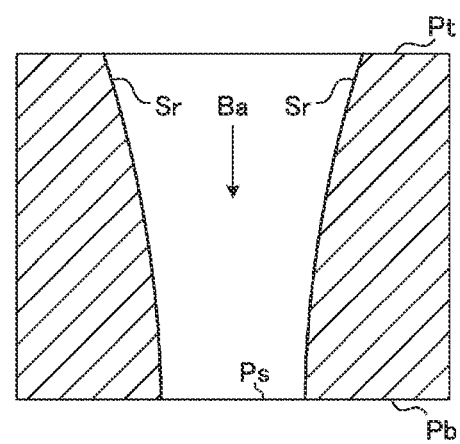
FIG. 7B shows an example of the cross-sectional shape of the resist film produced when the resist film is exposed to the pulsed laser light having the spectrum shown in FIG. 7A.

FIG. 7A shows a second example of the spectrum of the pulsed laser light outputted from the narrowed-line gas laser apparatus 100 in the first embodiment. FIG. 7B shows an example of the cross-sectional shape of the resist film produced when the resist film is exposed to the pulsed laser light having the spectrum shown in FIG. 7A.

Figure 8A:
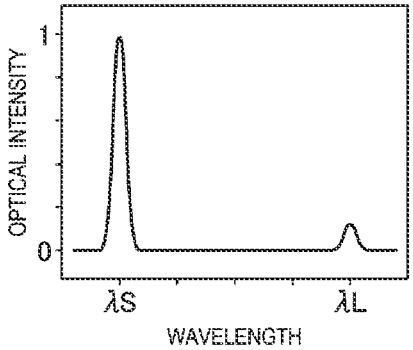
FIG. 8A shows a third example of the spectrum of the pulsed laser light outputted from the narrowed-line gas laser apparatus in the first embodiment.
Figure 8B:
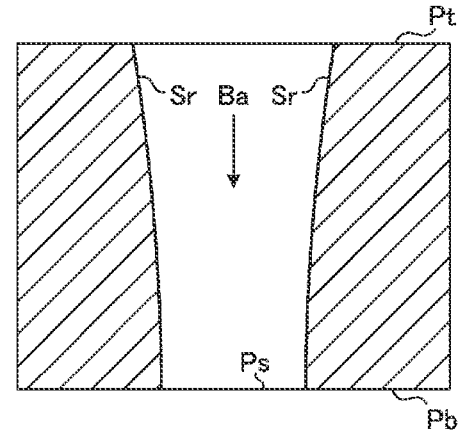
FIG. 8B shows an example of the cross-sectional shape of the resist film produced when the resist film is exposed to the pulsed laser light having the spectrum shown in FIG. 8A.

FIG. 8A shows a third example of the spectrum of the pulsed laser light outputted from the narrowed-line gas laser apparatus 100 in the first embodiment. FIG. 8B shows an example of the cross-sectional shape of the resist film produced when the resist film is exposed to the pulsed laser light having the spectrum shown in FIG. 8A.

In FIGS. 6A, 7A, and 8A, the spectrum of the pulsed laser light has a peak at the first wavelength λS and a peak at the second wavelength λL. The second wavelength λL is assumed to be longer than the first wavelength λS. The wavelength component having the first wavelength λS forms an image of the reticle pattern at a top surface Pt of the resist film, and the wavelength component having the second wavelength λL forms an image of the reticle pattern at a bottom surface Pb of the resist film or a surface Ps of the semiconductor wafer. The bottom surface Pb of the resist film coincides with or is parallel to the surface Ps of the semiconductor wafer.

Figure 9A:
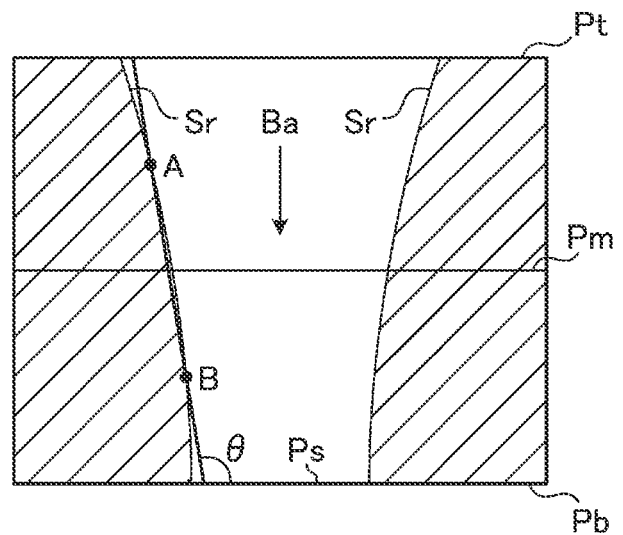
FIG. 9A shows the definition of a sidewall angle θ by way of example.
Figure 9B:
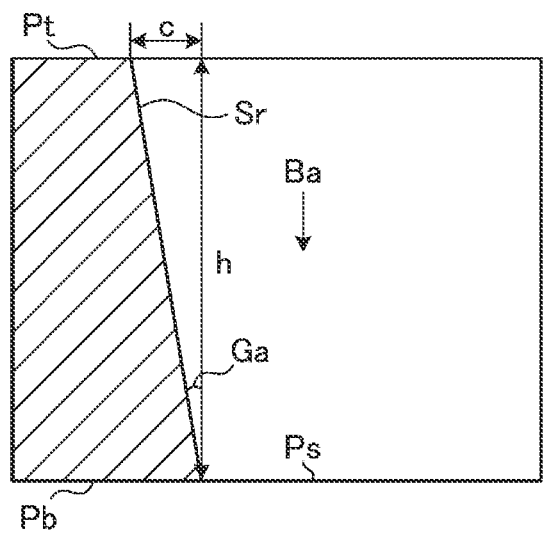
FIG. 9B shows another example of a second parameter for the sidewall angle.
Figure 9C:
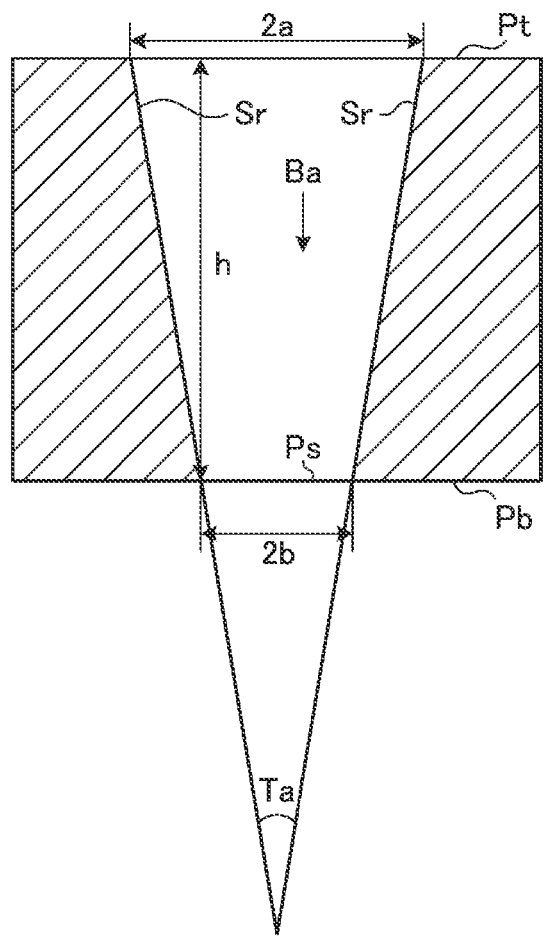
FIG. 9C shows still another example of the second parameter for the sidewall angle.

FIG. 9A shows the definition of the sidewall angle θ by way of example. The sidewall angle θ corresponds to the second parameter for the sidewall angle in the present disclosure. FIG. 9B shows another example of the second parameter for the sidewall angle. FIG. 9C shows still another example of the second parameter for the sidewall angle.

FIGS. 6B, 7B, 8B, and 9A to 9C all show cross sections parallel to an optical path axis Ba of the pulsed laser light and perpendicular to a sidewall Sr of the resist film. The optical path axis Ba of the pulsed laser light is substantially perpendicular to the surface Ps of the semiconductor wafer. FIGS. 6B, 7B, 8B, and 9A to 9C do not show the semiconductor wafer. The inclination of the sidewall Sr is exaggerated.

2.3.1 Example of Second Parameter for Sidewall Angle

A plane equidistant from the top surface Pt and the bottom surface Pb of the resist film is defined as an intermediate plane Pm, as shown in FIG. 9A. Let A be a point on the sidewall Sr, the point being equidistant from the top surface Pt and the intermediate plane Pm, and let B be a point on the sidewall Sr, the point being equidistant from the intermediate plane Pm and the bottom surface Pb. The angle between the exposed surface Ps of the semiconductor wafer from which the resist film has been removed and a straight line AB is defined as the sidewall angle θ.

The second parameter is not limited to the sidewall angle θ. The inclination of the sidewall Sr may be assessed under any other definition. The second parameter may be any of the following values:

[a] Gradient Ratio Gr $$Gr = c/h$$

where h is the thickness of the resist film, and c is the horizontal width of the sidewall Sr (see FIG. 9B).

[b] Gradient Ga $$Ga = \arctan(c/h)$$

FIG. 9C shows a cross-section of a hole formed in the resist film. The second parameter may be any of the following values:

[c] Taper Ratio Tr $$Tr = (2a - 2b)/h$$

where 2a is the diameter of the hole at the height of the top surface Pt of the resist film, and 2b is the diameter of the hole at the height of the bottom surface Pb of the resist film.

[d] Gradient Ratio Gr $$Gr = (a - b)/h$$
$$= Tr/2$$

[e] Taper Angle Ta $$Ta = 2 \cdot Ga$$

2.3.2 Example of First Parameter for the Energy Ratio

The definition of the energy ratio Rλ is shown below by way of example.

$$R\lambda = E\lambda S/(E\lambda S + E\lambda L)$$

where EλS is the pulse energy of the wavelength component having the first wavelength λS, and EλL is the pulse energy of the wavelength component having the second wavelength λL.

In the spectrum shown in FIG. 6A, when the ratio of the pulse energy EλS of the wavelength component having the first wavelength λS and the pulse energy EλL of the wavelength component having the second wavelength λL is 1:8, the energy ratio Rλ is calculated by the following equation:

$$R\lambda = 1/(1 + 8)$$
$$= 1/9$$

In the spectrum shown in FIG. 7A, when the ratio of the pulse energy EλS of the wavelength component having the first wavelength λS and the pulse energy EλL of the wavelength component having the second wavelength λL is 1:1, the energy ratio Rλ is calculated by the following equation:

$$R\lambda = 1/(1 + 1)$$
$$= 1/2$$

In the spectrum shown in FIG. 8A, when the ratio of the pulse energy EλS of the wavelength component having the first wavelength λS and the pulse energy EλL of the wavelength component having the second wavelength λL is 8:1, the energy ratio Rλ is calculated by the following equation:

$$R\lambda = 8/(8+1)$$
$$= 8/9$$

The energy ratio Rλ corresponds to the first parameter for the energy ratio in the present disclosure. The first parameter is, however, not limited to the energy ratio Rλ. The ratio between the first wavelength λS and the second wavelength λL may be assessed under any other definition.

The first parameter may have the following value:

$$R\lambda i = I\lambda S/(I\lambda S + I\lambda L)$$

where IλS is a peak value of the optical intensity of the wavelength component having the first wavelength λS, and IλL is a peak value of the optical intensity of the wavelength component having the second wavelength λL.

The first parameter may have the following value:

$$R = E\lambda S/E\lambda L$$

The first parameter may have the following value:

$$Ri = I\lambda S/I\lambda L$$

2.3.3 Relationship Between First and Second Parameters

Comparison among FIGS. 6B, 7B, and 8B shows that the sidewall angle θ of the resist film inclines by an amount greater than 90° in FIG. 6B, the sidewall angle θ is close to 90° in FIG. 8B, and in FIG. 7B, the sidewall angle θ is between the sidewall angle θ of the resist film in FIG. 6B and the sidewall angle θ of the resist film in FIG. 8B. As described above, when the energy ratio Rλ is set at a small value, the sidewall angle θ tends to be large, whereas when the energy ratio Rλ is set at a large value, the sidewall angle θ tends to be small. The sidewall angle θ of the resist film can therefore be controlled by adjusting the energy ratio Rλ between the energy of the wavelength component having the first wavelength λS and the energy of the wavelength component having the second wavelength λL.

FIG. 10 is a graph showing an example of the relationship of the energy ratio Rλ between the energy of the wavelength component having the first wavelength λS and the energy of the wavelength component having the second wavelength λL with the sidewall angle θ of the resist film. FIG. 10 shows the relationship indicating that the sidewall angle θ approaches 90° as the energy ratio Rλ increases. That is, the greater the energy ratio Rλ, the more the sidewall Sr is close to parallel to the optical path axis Ba of the pulsed laser light.

FIG. 11 is a table showing the example of the relationship of the energy ratio Rλ between the energy of the wavelength component having the first wavelength λS and the energy of the wavelength component having the second wavelength λL with the sidewall angle θ of the resist film. In FIG. 11, values of the energy ratio Rλ, Rλ1, Rλ2, Rλ3, . . . , are associated with values of the sidewall angle θ, θ1, θ2, θ3, . . . .

The relationship between the energy ratio Rλ and the sidewall angle θ is determined in advance by measurement or simulation. Data showing the relationship between the energy ratio Rλ and the sidewall angle θ is stored in the memory 212 in the form of the graph shown in FIG. 10, an approximate expression thereof, or the table shown in FIG. 11. The exposure control processor 210 sets the target value Rλt of the energy ratio Rλ based on the data representing the relationship between the energy ratio Rλ and the sidewall angle θ and the target value θt of the sidewall angle θ.

2.4 Operation of Exposure Control Processor 210

Figure 12:
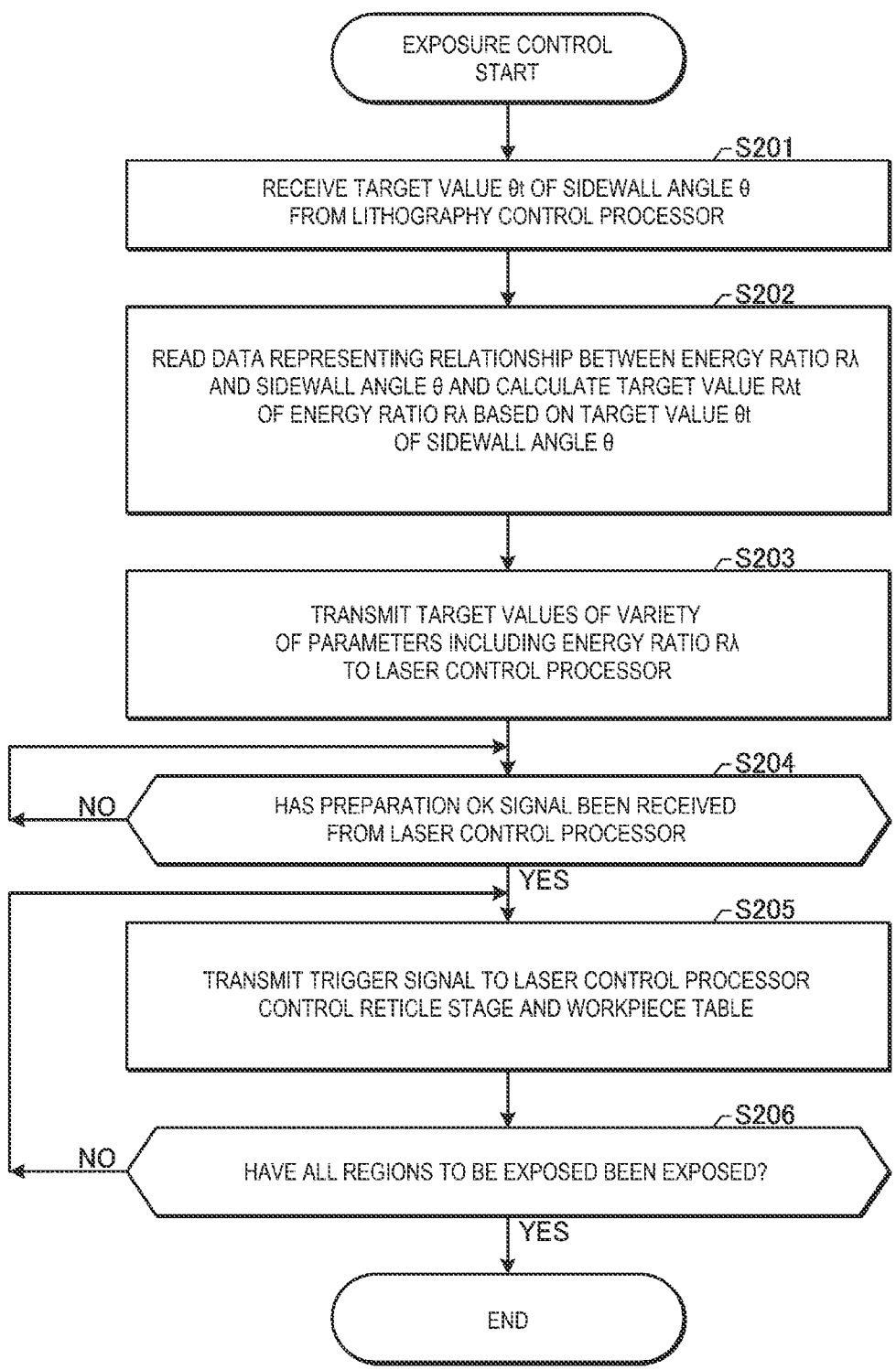
FIG. 12 is a flowchart showing the procedure in accordance with which an exposure control processor performs exposure control.

FIG. 12 is a flowchart showing the procedure in accordance with which the exposure control processor 210 performs exposure control. The exposure control processor 210 sets the target value Rλt of the energy ratio Rλ by carrying out the following processes, and causes the narrowed-line gas laser apparatus 100 to perform laser oscillation, which produces the pulsed laser light for exposure.

In S201, the exposure control processor 210 receives the target value θt of the sidewall angle θ from the lithography control processor 310.

Thereafter, in S202, the exposure control processor 210 reads the data representing the relationship between the energy ratio Rλ and the sidewall angle θ from the memory 212. The exposure control processor 210 calculates the target value Rλt of the energy ratio Rλ based on the read data and the target value θt of the sidewall angle θ.

Thereafter, in S203, the exposure control processor 210 transmits target values of a variety of parameters to the laser control processor 130. The variety of parameters include the first wavelength λS, the second wavelength λL, the pulse energy E, and other parameters, as well as the energy ratio Rλ. The target values of the variety of parameters further include the target value λSt of the first wavelength λS, the target value λLt of the second wavelength λL, a target value Et of the pulse energy E, and other parameters, as well as the target value Rλt of the energy ratio Rλ.

Thereafter, in S204, the exposure control processor 210 waits for receipt of a preparation OK signal from the laser control processor 130. That is, the exposure control processor 210 repeats evaluation of whether or not the preparation OK signal has been received until the receipt of the preparation OK signal. The preparation OK signal outputted by the laser control processor 130 will be described later with reference to FIG. 13.

Upon receipt of the preparation OK signal in S204 (YES in S204), the exposure control processor 210 proceeds to S205.

In S205, the exposure control processor 210 transmits the trigger signal for the laser oscillation to the laser control processor 130. The exposure control processor 210 further controls the reticle stage RT and the workpiece table WT. The exposure control processor 210 performs the control described above to allow the exposure apparatus 200 to expose the resist film to the light.

Thereafter, in S206, the exposure control processor 210 evaluates whether or not all the regions of the semiconductor wafer that are to be exposed have been exposed. When all the regions to be exposed have not been exposed (NO in S206), the exposure control processor 210 returns to the process in S205. When all the regions to be exposed have been exposed (YES in S206), the exposure control processor 210 terminates the processes in the flowchart.

2.5 Operation of Laser Control Processor 130

Figure 13:
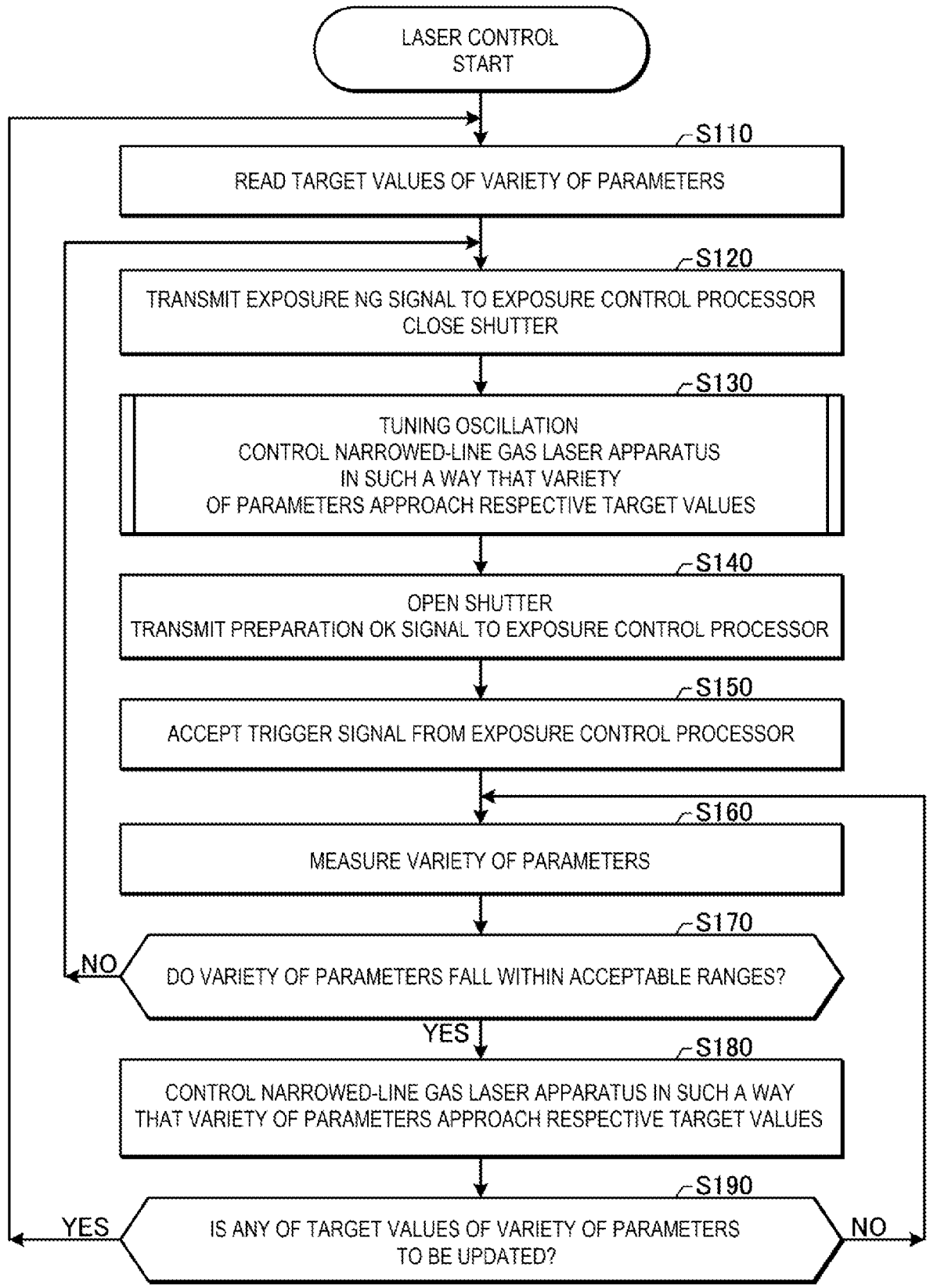
FIG. 13 is a flowchart showing the procedure in accordance with which a laser control processor performs laser control.

FIG. 13 is a flowchart showing the procedure in accordance with which the laser control processor 130 performs laser control. When the laser control processor 130 receives the target values of the variety of parameters from the exposure control processor 210 in accordance with the processes in FIG. 12, the laser control processor 130 performs laser control in accordance with the processes below.

In S110, the laser control processor 130 reads the target values of the variety of parameters.

Thereafter, in S120, the laser control processor 130 transmits an exposure NG signal to the exposure control processor 210. Furthermore, the laser control processor 130 closes the shutter 18. The pulsed laser light is thus not allowed to enter the exposure apparatus 200.

Thereafter, in S130, the laser control processor 130 performs tuning oscillation. In the tuning oscillation, the narrowed-line gas laser apparatus 100 is so controlled that the variety of parameters approach the respective target values. The variety of parameters include the energy ratio $R\lambda$, the first wavelength $\lambda S$, the second wavelength $\lambda L$, the pulse energy E, and other parameters. The tuning oscillation will be described later in detail with reference to FIG. 14.

Thereafter, in S140, the laser control processor 130 opens the shutter 18. The pulsed laser light is thus allowed to enter the exposure apparatus 200. Furthermore, the laser control processor 130 transmits the preparation OK signal to the exposure control processor 210.

Thereafter, in S150, the laser control processor 130 accepts the trigger signal from the exposure control processor 210. The laser control processor 130 transmits the oscillation trigger signal based on the trigger signal to the switch 13a of the pulse power module 13 (see FIG. 2) to cause the gas laser apparatus to start the laser oscillation.

Thereafter, in S160, the laser control processor 130 measures the variety of parameters.

Thereafter, in S170, the laser control processor 130 calculates differences between the variety of parameters and the respective target values, and evaluates whether or not the values of the variety of parameters fall within acceptable ranges. When any of the values of the variety of parameters does not fall within the acceptable range (NO in S170), the laser control processor 130 returns to the process in S120. When the values of the variety of parameters fall within the acceptable ranges (YES in S170), the laser control processor 130 proceeds to the process in S180.

In S180, the laser control processor 130 controls the narrowed-line gas laser apparatus 100 in such a way that the variety of parameters approach the respective target values.

Thereafter, in S190, the laser control processor 130 evaluates whether or not any of the target values of the variety of parameters is to be updated. For example, when a new target value is received from the exposure control processor 210, the laser control processor 130 determines that the target value of the corresponding one of the variety of parameters is to be updated. When any of the target values of the variety of parameters is to be updated (YES in S190), the laser control processor 130 returns to the process in S110. When none of the target values of the variety of parameters is to be updated (NO in S190), the laser control processor 130 returns to the process in S160.

The laser control is performed as described above.

FIG. 14 is a flowchart showing the procedure in accordance with which tuning oscillation is performed. The processes shown in FIG. 14 correspond to the subroutine labeled with step S130 in FIG. 13.

In S131, the laser control processor 130 starts generating an internal trigger signal. The internal trigger signal is an oscillation trigger signal generated by the laser control processor 130 and transmitted to the switch 13a of the pulse power module 13 not based on the trigger signal from the exposure control processor 210.

Thereafter, in S132, the laser control processor 130 controls the narrowed-line gas laser apparatus 100 in such a way that the variety of parameters approach the respective target values. The variety of parameters include the energy ratio $R\lambda$, the first wavelength $\lambda S$, the second wavelength $\lambda L$, the pulse energy E, and other parameters.

Thereafter, in S133, the laser control processor 130 measures the variety of parameters.

Thereafter, in S134, the laser control processor 130 calculates differences between the variety of parameters and the respective target values, and evaluates whether or not the values of the variety of parameters fall within the acceptable ranges. When any of the values of the variety of parameters does not fall within the acceptable range (NO in S134), the laser control processor 130 returns to the process in S132. When the values of the variety of parameters fall within the acceptable ranges (YES in S134), the laser control processor 130 proceeds to the process in S135.

In S135, the laser control processor 130 stops generating the internal trigger signal. The tuning oscillation is thus terminated. After S135, the laser control processor 130 terminates the processes in the flowchart and returns to the processes shown in FIG. 13.

In the other respects, the configurations and operations in the first embodiment are the same as those in Comparative Example.

2.6 Other Configuration Examples

The first embodiment has been described with reference to the case where the lithography control processor 310 sets the target value $\theta t$ of the sidewall angle $\theta$, but not necessarily in the present disclosure. For example, the exposure control processor 210 may set the target value $\theta t$ of the sidewall angle $\theta$.

The first embodiment has been described with reference to the case where the exposure control processor 210 determines the target value $R\lambda t$ of the energy ratio $R\lambda$ based on the data representing the relationship between the sidewall angle $\theta$ and the energy ratio $R\lambda$, and the target value $\theta t$ of the sidewall angle $\theta$, but not necessarily in the present disclosure. For example, the lithography control processor 310 may determine the target value $R\lambda t$ of the energy ratio $R\lambda$.

The function of one of the lithography control processor 310 and the exposure control processor 210 may be performed by the other.

The function of one of the exposure control processor 210 and the laser control processor 130 may be performed by the other.

The lithography control processor 310, the exposure control processor 210, and the laser control processor 130 may each correspond to the processor in the present disclosure. Instead, an arbitrary combination of two or more of the lithography control processor 310, the exposure control processor 210, and the laser control processor 130 may correspond to the processor in the present disclosure.

The first embodiment has been described with reference to the case where the plane parallel substrate 61 is disposed so as to overlap with part of the cross section of the optical path of the light beam, and the energy ratio $R\lambda$ is changed by moving the plane parallel substrate 61, but not necessarily in the present disclosure. The energy ratio $R\lambda$ may instead be changed by rotating the plane parallel substrate 61 so disposed that the entire light beam is incident thereon around an axis parallel to the axis H to change the amount of shift of the optical path axis. Still instead, a combination of a plurality of prisms (not shown) may be disposed in the optical path in place of the plane parallel substrate 61, and any of the plurality of prisms may be moved to change the amount of shift of the optical path axis.

The first embodiment has been described with reference to the case where the tuning oscillation is performed when the laser control processor 130 receives target values of the variety of parameters, but not necessarily in the present disclosure. In a case where the variety of parameters can be accurately controlled, the pulsed laser light may be outputted to the exposure apparatus 200 with the tuning oscillation not performed.

2.7 Effects

In the first embodiment, the exposure control processor 210 reads data representing the relationship between the first parameter relating to the energy ratio $R\lambda$ and the second parameter relating to the sidewall angle $\theta$ of the resist film. The energy ratio $R\lambda$ is the ratio between the energy of the first pulsed laser light having the first wavelength $\lambda S$ and the energy of the second pulsed laser light having the second wavelength $\lambda L$ longer than the first wavelength $\lambda S$. The sidewall angle $\theta$ of the resist film is the angle between the exposed surface Ps of the semiconductor wafer, from which the resist film is removed, and the sidewall Sr in the case where the resist film is exposed to the first pulsed laser light having the first wavelength $\lambda S$ and the second pulsed laser light having the second wavelength $\lambda L$ longer than the first wavelength $\lambda S$. The exposure control processor 210 determines a target value of the first parameter based on data representing the relationship between the first and second parameters and a target value of the second parameter. The target value of the second parameter is, for example, the target value $\theta t$ of the sidewall angle $\theta$ of the resist film. The target value of the first parameter is, for example, the target value $R\lambda t$ of the energy ratio $R\lambda$. The laser control processor 130 controls the narrowed-line gas laser apparatus 100 so as to output the first pulsed laser light and the second pulsed laser light based on the target value of the first parameter, and the exposure apparatus 200 exposes the resist film to the first and second pulsed laser light.

The sidewall angle $\theta$ of the resist film can thus be brought closer to a desired value by adjustment of the energy ratio $R\lambda$.

In the first embodiment, the data representing the relationship between the first and second parameters includes the relationship showing that the greater the ratio of the pulse energy $E\lambda S$ of the first pulsed laser light to the sum of the pulse energy $E\lambda S$ of the first pulsed laser light and the pulse energy $E\lambda L$ of the second pulsed laser light, the more the sidewall Sr of the resist film is close to parallel to the optical path axis Ba of either the first pulsed laser light or the second pulsed laser light.

In the first embodiment, the resist film is irradiated with the first pulsed laser light and the second pulsed laser light in the form of temporally overlapping pulses. Two-wavelength exposure can thus be performed without high-speed switching of the oscillation wavelength.

3. EXPOSURE SYSTEM THAT PERFORMS WAVELENGTH SWITCHING ON A PULSE BASIS

3.1 Configuration

Figure 15A:
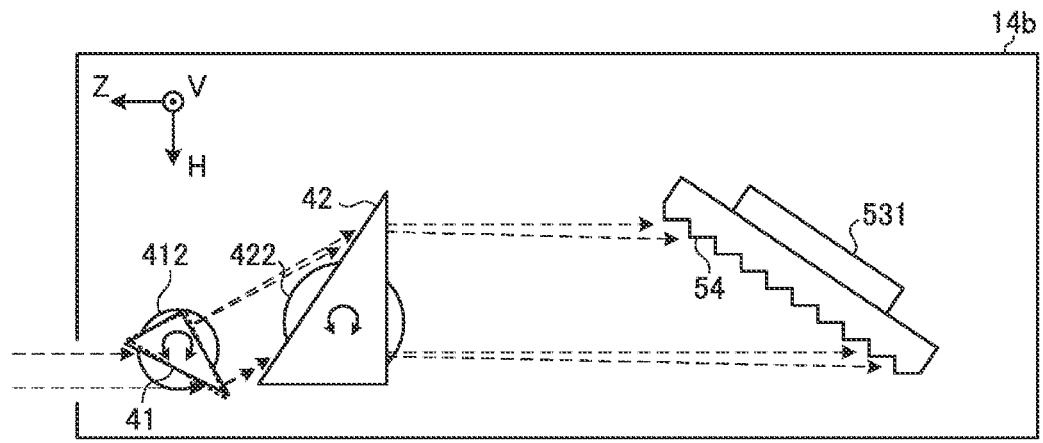
FIGS. 15A and 15B schematically show the configuration of a line narrowing apparatus in a second embodiment.
Figure 15B:
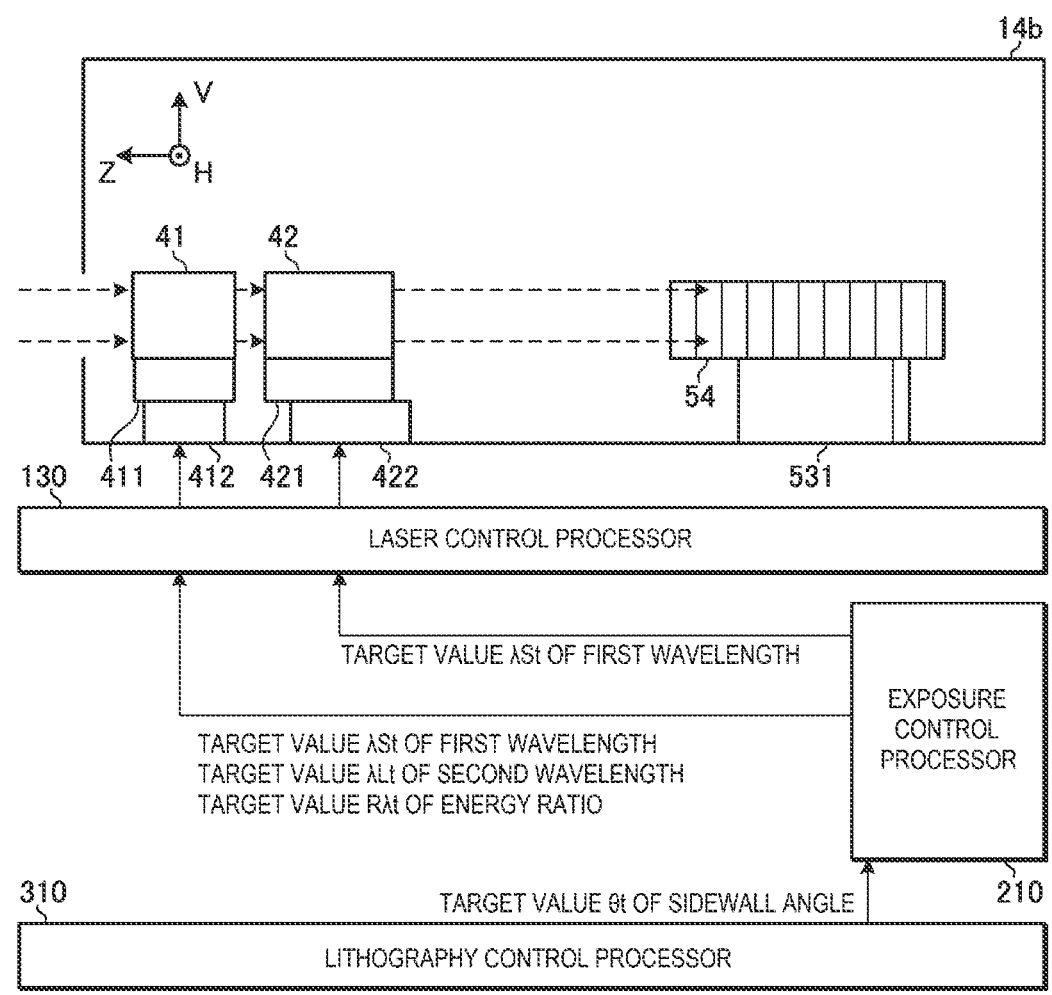

FIGS. 15A and 15B schematically show the configuration of a line narrowing apparatus 14b in a second embodiment. FIG. 15A shows the line narrowing apparatus 14b viewed in the direction –V, and FIG. 15B shows the line narrowing apparatus 14b viewed in the direction –H.

The line narrowing apparatus 14b includes a grating 54 in place of the grating system 50 (see FIGS. 5A and 5B). The grating 54 is disposed in the optical path of the light beam having passed through the second prism 42 and is supported by a holder 531 so as to maintain a fixed posture. The direction of the grooves of the grating 54 coincides with the direction of the axis V.

A rotary stage 412 allows the first prism 41 provided in the line narrowing apparatus 14b to rotate around an axis parallel to the axis V. An example of the rotary stage 412 may be a highly responsive rotary stage rotated by a piezoelectric element.

The line narrowing apparatus 14b may not include the plane parallel substrate 61.

3.2 Operation of Narrowed-Line Gas Laser Apparatus 100

The light beam having exited via the window 10a passes through the first prism 41 and the second prism 42 and is incident on the grating 54. The wavelength of the light that returns from the grating 54 to the laser chamber 10 via the second prism 42 and the first prism 41 is adjusted by the postures of the prisms.

The laser control processor 130 controls the rotary stage 422 for the second prism 42 based on the target value $\lambda St$ of the first wavelength $\lambda S$ received from the exposure control processor 210.

The laser control processor 130 controls the rotary stage 412 for the first prism 41 based on both the target value $\lambda St$ of the first wavelength $\lambda S$ and the target value $\lambda Lt$ of the second wavelength $\lambda L$ received from the exposure control processor 210 or the difference between the target values. The rotary stage 412 changes the posture of the first prism 41 to switch the state of the light beam between a first state in which the light beam having passed through the first prism 41 is incident on the grating 54 at a first angle of incidence and a second state in which the light beam having passed through the first prism 41 is incident on the grating 54 at a second angle of incidence. FIG. 15A shows the optical paths of the two light beams in the first and second states. The laser control processor 130 controls the rotary stage 412 in such a way that the posture of the first prism 41 is periodically switched from one state to the other every set number of pulses N that form one cycle. The wavelength of the pulsed laser light is thus periodically switched between the first wavelength $\lambda S$ and the second wavelength every pulses N, which form one cycle.

Since the first prism 41 is disposed in a position upstream from the second prism 42, where the beam width is increased, the first prism 41 has a smaller size and can therefore be controlled faster.

The present embodiment has been presented by way of example as the case where the rotary stage 422 for the second prism 42 is controlled based on the target value $\lambda St$ of the first wavelength $\lambda S$, but not necessarily in the present disclosure. When the first wavelength $\lambda S$ and the second wavelength can be adjusted to the target values $\lambda St$ and $\lambda Lt$, respectively, only by controlling the rotation of the first prism 41, the second prism 42 may not be rotationally controlled.

Figure 16:
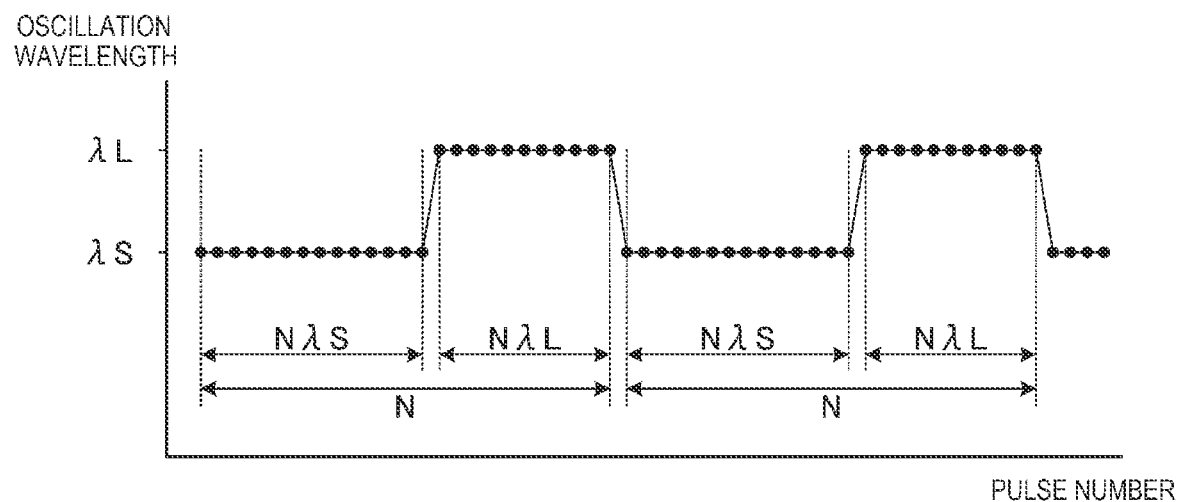
FIG. 16 is a graph showing changes in oscillation wavelength in the second embodiment.

FIG. 16 is a graph showing changes in the oscillation wavelength in the second embodiment. In FIG. 16, the horizontal axis represents the pulse number, and the vertical axis represents the oscillation wavelength.

In the example shown in FIG. 16, the pulses having the first wavelength κS and the pulses having the second wavelength λL are periodically switched from one to the other, and the selected pulses are outputted every set N pulses, which form one cycle. Specifically, the first pulsed laser light formed of NλS pulses having the first wavelength λS is continuously outputted, and the second pulsed laser light formed of NλL pulses having the second wavelength λL is continuously outputted. The wavelength is then periodically switched every cycle corresponding to the output of the first pulsed laser light formed of the NλS pulses and the second pulsed laser light formed of the NλL pulses. The number of pulses N, which form one cycle, corresponds to the sum of NλS and NλL.

The definition of the energy ratio Rλ in the second embodiment is shown below by way of example.

$$R\lambda = N\lambda S/(N\lambda S + N\lambda L)$$

It is assumed that the pulse energy at the first wavelength λS and the pulse energy at the second wavelength λL are equal to each other.

Figures 17A, 17B, 17C:
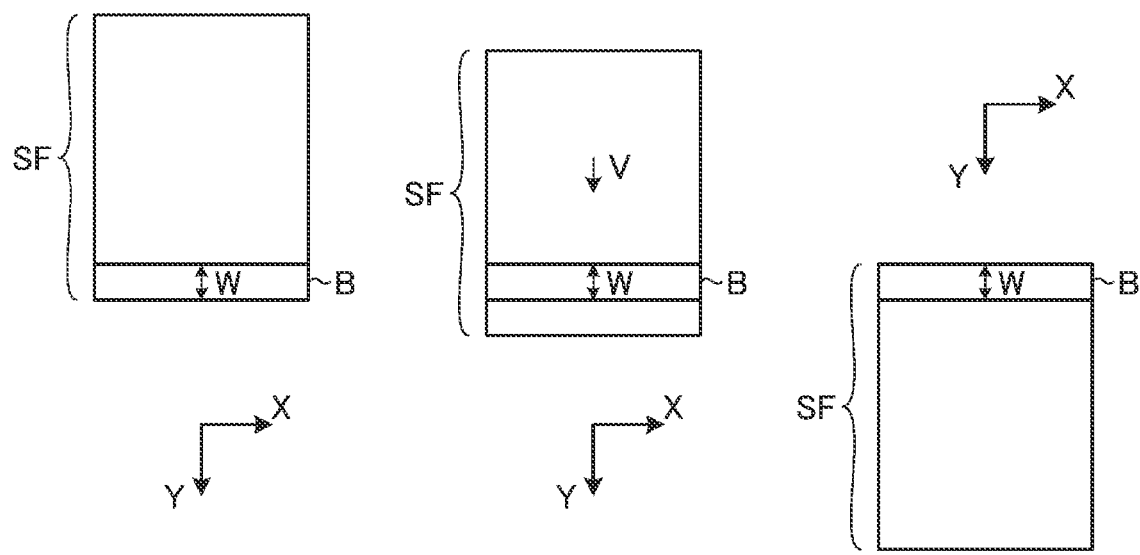
FIGS. 17A to 17C show how the position of a scan field of a semiconductor wafer changes with respect to the position of the pulsed laser light.

FIGS. 17A to 17C show how the position of a scan field SF of the semiconductor wafer changes with respect to the position of the pulsed laser light. The scan field SF of the semiconductor wafer corresponds, for example, to the region where some of a large number of semiconductor chips to be formed in the semiconductor wafer are to be formed. The scan field SF is coated with the resist film. The width of the scan field SF in an axis-X direction is equal to the width, in the axis-X direction, of the beam cross-section of the pulsed laser light in the position of the semiconductor wafer. The width of the scan field SF in an axis-Y direction is greater than a width W, in the axis-Y direction, of the beam cross-section of the pulsed laser light in the position of the semiconductor wafer.

The procedure in accordance with which the scan field SF is exposed to the pulsed laser light is performed in the order of FIGS. 17A, 17B, and 17C. First, the workpiece table WT is so positioned that the position of the pulsed laser light coincides with one end of the scan field SF in the axis-Y direction, as shown in FIG. 17A. The workpiece table WT is so moved that the position of the scan field SF changes at a speed V with respect to the position of the pulsed laser light, as shown in FIG. 17B. When the workpiece table WT is moved to a position where the position of the pulsed laser light coincides with the other end of the scan field SF in the axis-Y direction, the exposure of the scan field SF to the pulsed laser light is completed, as shown in FIG. 17C. The exposure is thus performed while the scan field SF moves with respect to the position of the pulsed laser light.

A period T required for the scan field SF to move at the speed V over a distance corresponding to the width W of the beam cross section of the pulsed laser light is as follows:

$$T = W/V$$

A total number of pulses Ns of the first pulsed laser light and the second pulsed laser light radiated to any one location in the scan field SF is equal to the number of pulses of the pulsed laser light generated in the required period T and is as follows:

$$Ns = F \cdot T$$
$$= F \cdot W/V$$

where F represents the repetitive frequency of the pulsed laser light.

The total number of pulses Ns is also referred to as the number of N slit pulses.

The number of pulses N, which form one wavelength-switching cycle, is so set that the number of N slit pulses Ns is a multiple of the number of pulses N, which form one cycle. The ratio between the number of pulses of the first pulsed laser light and the number of pulses of the second pulsed laser light can thus be fixed at all locations in the scan field SF. For example, the number of pulses N, which form one cycle, is set so as to be equal to the number of N slit pulses Ns. The first pulsed laser light formed of NλS pulses and the second pulsed laser light formed of NλL pulses are thus radiated to any one location in the scan field SF.

Referring again to FIG. 15B, the laser control processor 130 receives the target value Rλt of the energy ratio Rλ from the exposure control processor 210. Based on the target value Rλt, the laser control processor 130 determines the number of pulses NλS having the first wavelength λS per wavelength-switching cycle and the number of pulses NλL having the second wavelength λL per wavelength-switching cycle. The laser control processor 130 sets the timing at which the rotary stage 412 is controlled based on the number of pulses NλS and the number of pulses NλL.

The operation of the exposure control processor 210 in the second embodiment is the same as that described with reference to FIG. 12.

3.3 Operation of Laser Control Processor 130

Figure 18:
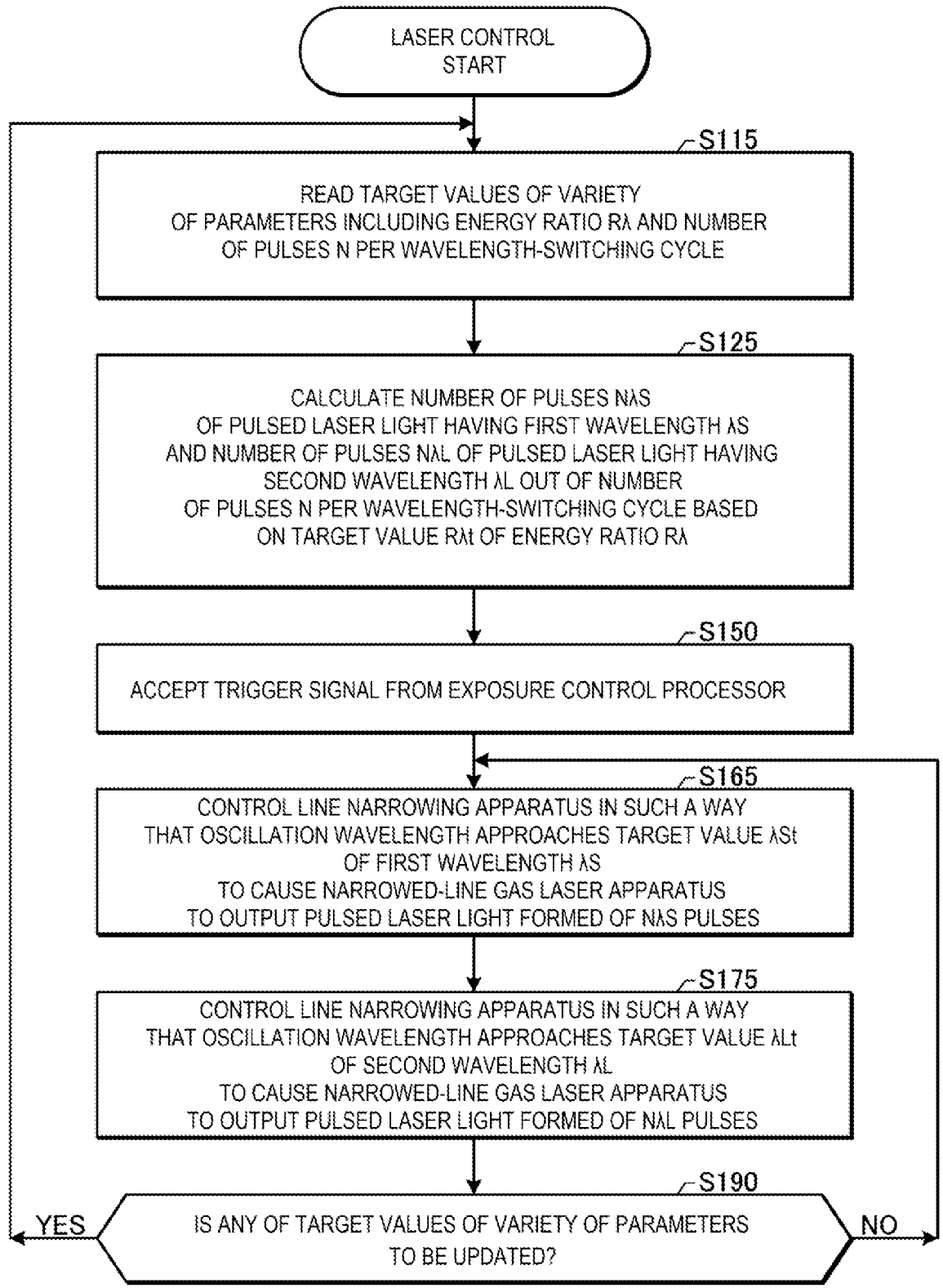
FIG. 18 is a flowchart showing the procedure in accordance with which the laser control processor performs the laser control.

FIG. 18 is a flowchart showing the procedure in accordance with which the laser control processor 130 performs the laser control. When the laser control processor 130 receives the target values of the variety of parameters from the exposure control processor 210 in accordance with the processes in FIG. 12, the laser control processor 130 performs the laser control in accordance with the processes below.

In S115, the laser control processor 130 reads the target values of the variety of parameters. The variety of parameters include the energy ratio Rλ, the first wavelength λS, the second wavelength λL, the pulse energy E, and other parameters. The laser control processor 130 further reads the number of pulses N per wavelength-switching cycle.

Thereafter, in S125, the laser control processor 130 calculates the number of pulses NλS of the first pulsed laser light having the first wavelength κS and the number of pulses NλL of the second pulsed laser light having the second wavelength λL out of the number of pulses N per cycle based on the target value Rλt of the energy ratio Rλ. The numbers of pulses described above are calculated, for example, as follows:

$$N\lambda S = ROUND(R\lambda \cdot N), \text{ and}$$

$$N\lambda L = N - N\lambda S$$

where ROUND (X) means X rounded off to the nearest whole number.

Thereafter, in S150, the laser control processor 130 accepts the trigger signal from the exposure control processor 210. The process in step S150 is the same as that described with reference to FIG. 13.

Thereafter, in S165, the laser control processor 130 controls the line narrowing apparatus 14b in such a way that the oscillation wavelength approaches the target value λSt of the first wavelength λS. The laser control processor 130 continues the process until the narrowed-line gas laser apparatus 100 outputs the pulsed laser light formed of the NλS pulses.

Thereafter, in S175, the laser control processor 130 controls the line narrowing apparatus 14b in such a way that the oscillation wavelength approaches the target value λLt of the second wavelength λL. The laser control processor 130 continues the process until the narrowed-line gas laser apparatus 100 outputs the pulsed laser light formed of the NλL pulses.

Thereafter, in S190, the laser control processor 130 evaluates whether or not any of the target values of the variety of parameters is to be updated. The process in step S190 is the same as that described with reference to FIG. 13. When any of the target values of the variety of parameters is to be updated (YES in S190), the laser control processor 130 returns to the process in S115. When none of the target values of the variety of parameters is to be updated (NO in S190), the laser control processor 130 returns to the process in S165.

The laser control is performed as described above.

In the other respects, the configurations and operations in the second embodiment are the same as those in the first embodiment.

3.4 Other Configuration Examples

The second embodiment has been described with reference to the case where the lithography control processor 310 sets the target value θt of the sidewall angle θ, but not necessarily in the present disclosure. For example, the exposure control processor 210 may set the target value θt of the sidewall angle θ.

The second embodiment has been described with reference to the case where the laser control processor 130 sets the number of pulses NλS and the number of pulses NλL, but not necessarily in the present disclosure. For example, the exposure control processor 210 may set the number of pulses NλS and the number of pulses NλL.

The second embodiment has been described with reference to the case where the posture of the first prism 41 is switched to another every N pulses, which form one cycle, but not necessarily in the present disclosure. For example, the posture of the second prism 42 or the grating 54 may be switched to another every N pulses, which form one cycle.

3.5 Effects

In the second embodiment, the first pulsed laser light having the first wavelength λS and the second pulsed laser light having the second wavelength λL are periodically switched from one to the other and radiated to the resist film every set N pulses, which form one cycle. The two-wavelength exposure can thus be performed without use of a complicated grating system.

In the second embodiment, the number of pulses NλS of the first pulsed laser light and the number of pulses NλL of the second pulsed laser light out of the set number of pulses N, which form one cycle, are determined based on the target value of the first parameter. The target value of the first parameter is, for example, the target value Rλt of the energy ratio Rλ. The energy ratio can thus be controlled by the simple calculation.

In the second embodiment, the total number of pulses Ns of the first pulsed laser light and the second pulsed laser light radiated to one location on the resist film is a multiple of the set number of pulses N, which form one cycle. The ratio of the number of pulses of the first pulsed laser light and the number of pulses of the second pulsed laser light can thus be fixed, so that the energy ratio Rλ can be fixed even when the radiation start timing varies at different positions in the scan field SF.

4. EXPOSURE SYSTEM INCLUDING RESIST FILM INSPECTION APPARATUS 701

4.1 Configuration

Figure 19:
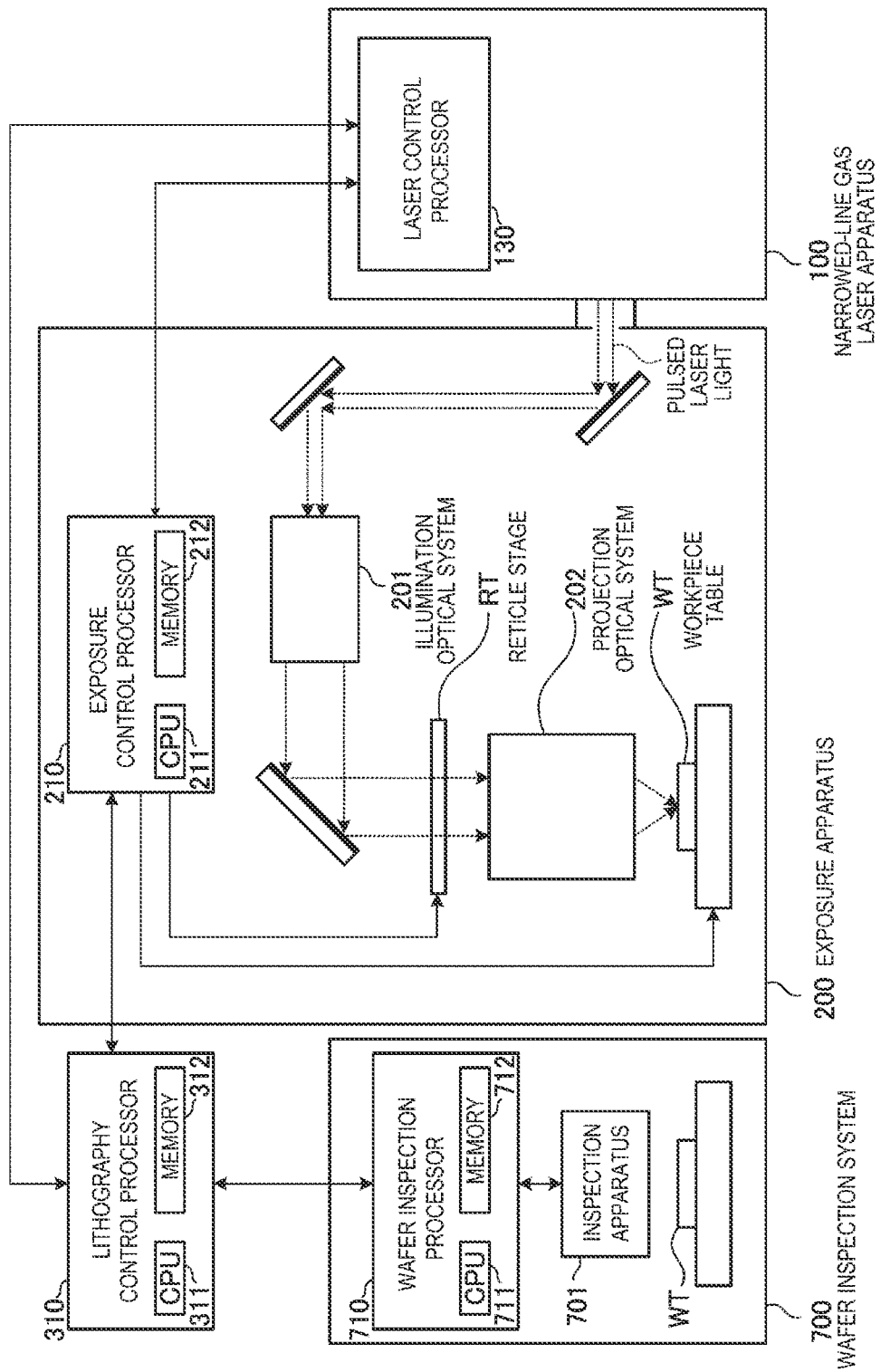
FIG. 19 schematically shows the configuration of an exposure system according to a third embodiment.

FIG. 19 schematically shows the configuration of an exposure system according to a third embodiment. The exposure system includes a wafer inspection system 700 as well as the narrowed-line gas laser apparatus 100, the exposure apparatus 200, and the lithography control processor 310. The wafer inspection system 700 includes an inspection apparatus 701 and a wafer inspection processor 710.

The inspection apparatus 701 is, for example, an apparatus that radiates laser light onto a semiconductor wafer that is not shown but is placed on the workpiece table WT, and detects the laser light reflected off or diffracted by the semiconductor wafer to measure the sidewall angle θ of the resist film. Instead, the inspection apparatus 701 may be an apparatus that includes a high-resolution scanning electron microscope (SEM), captures an image of the sidewall Sr, and measures the sidewall angle θ of the resist film.

The wafer inspection processor 710 is a processing apparatus including a memory 712, which stores a control program, and a CPU 711, which executes the control program. The wafer inspection processor 710 is particularly configured or programmed to carry out a variety of processes contained in the present disclosure. The wafer inspection processor 710 is connected to each of the inspection apparatus 701 and the lithography control processor 310 and transmits and receives a variety of data and signals to and from the inspection apparatus 701 and the lithography control processor 310.

In the third embodiment, the lithography control processor 310 may be connected to each of the exposure control processor 210 and the wafer inspection processor 710, and may also be connected to the laser control processor 130.

FIG. 20 shows an example of a table stored in the memory 312 of the lithography control processor 310. The memory 312 stores a variety of parameters including the energy ratio Rλ, and the sidewall angle θ measured by the wafer inspection system 700 in association with each other. The variety of parameters include the first wavelength λS, the second wavelength λL, and the pulse energy E, as well as the energy ratio Rλ.

The table shown in FIG. 20 stores records that associate the variety of parameters with the sidewall angle θ, as well as additional information that specifies the name of the resist material, the thickness of the resist, and the exposure conditions. The table may be created in the form of separate tables on a resist material name basis, on a resist thickness basis, and on an exposure condition basis.

4.2 Operation of Lithography Control Processor 310

Figure 21:
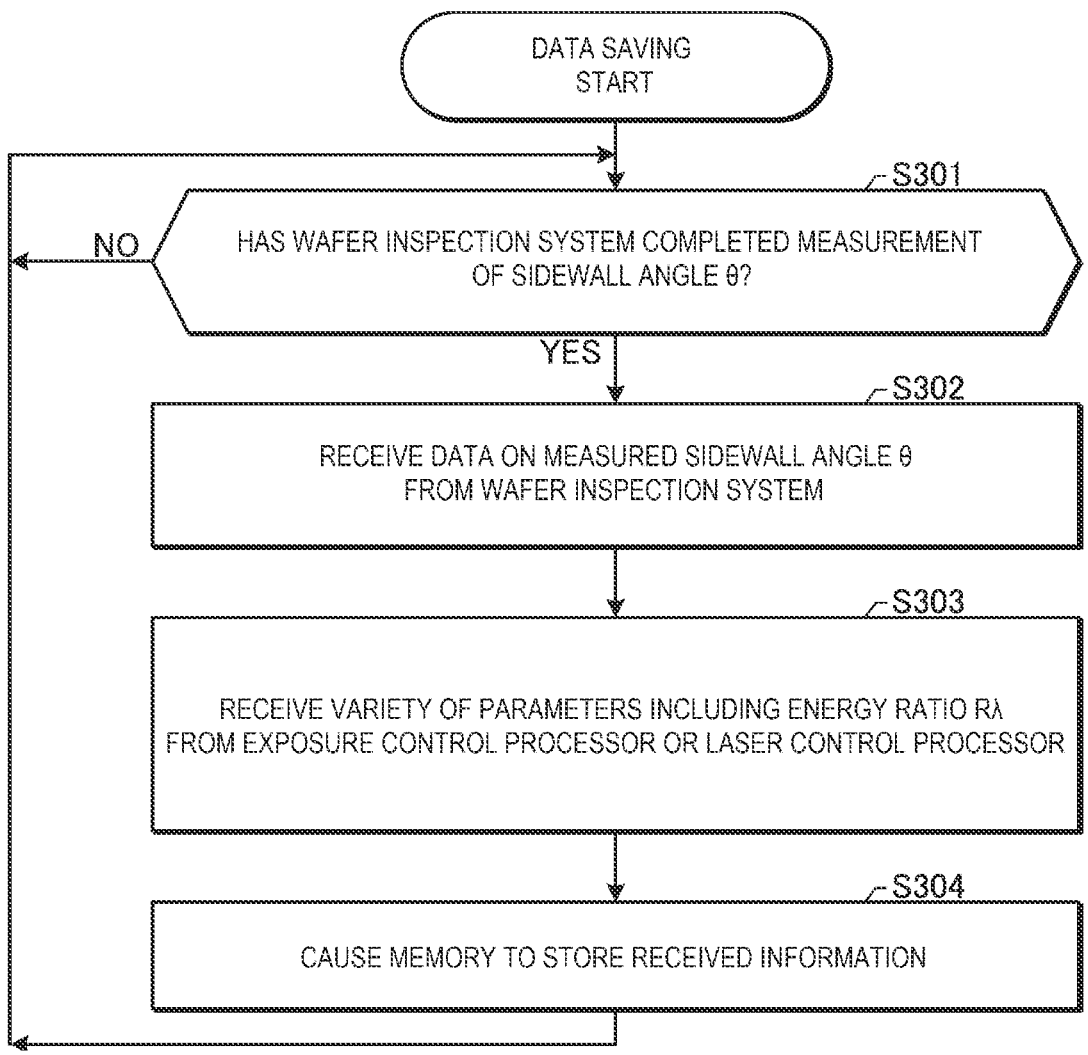
FIG. 21 is a flowchart showing the procedure in accordance with which the lithography control processor performs data saving.

FIG. 21 is a flowchart showing the procedure in accordance with which the lithography control processor 310 performs data saving. The lithography control processor 310 causes the memory 312 to store the data that associate the variety of parameters with the sidewall angle θ by carrying out the processes below.

In S301, the lithography control processor 310 evaluates whether or not the wafer inspection system 700 has completed the measurement of the sidewall angle θ. When the measurement of the sidewall angle θ has not been completed (NO in S301), the lithography control processor 310 repeats the evaluation in S301 until the measurement of the sidewall angle θ is completed. When the measurement of the sidewall angle θ is completed (YES in S301), the lithography control processor 310 proceeds to the process in S302.

In S302, the lithography control processor 310 receives data on the measured sidewall angle θ from the wafer inspection system 700. The measurement data may include a wafer ID that identifies the semiconductor wafer under measurement, or an exposure ID that identifies the exposure performed on the semiconductor wafer.

Thereafter, in S303, the lithography control processor 310 receives the variety of parameters held in the exposure control processor 210 from the exposure control processor 210. When the laser control processor 130 holds the variety of parameters, the lithography control processor 310 may receive the variety of parameters from the laser control processor 130. The contents of the variety of parameters have been described with reference to FIG. 20. The variety of parameters may be data on actually measured values of the parameters, or data on target values thereof.

The variety of parameters are parameters used when the semiconductor wafer where the sidewall angle θ of which has been measured is exposed to the light. The variety of parameters may include the wafer ID, which identifies the semiconductor wafer, or the exposure ID, which identifies the exposure performed on the semiconductor wafer. The lithography control processor 310 may compare the wafer ID or the exposure ID received in S302 with the wafer ID or the exposure ID received in S303.

Thereafter, in S304, the lithography control processor 310 updates the data by causing the memory 312 to store the received information. The contents of the information to be stored have been described with reference to FIG. 20. The lithography control processor 310 may add a new record to the table shown in FIG. 20, or may overwrite part of the records with new records.

After S304, the lithography control processor 310 returns to the process in S301.

As described above, the measurement data is saved whenever the sidewall angle θ is measured.

FIG. 22 is a flowchart showing the procedure in accordance with which the lithography control processor 310 performs lithography control. The lithography control processor 310 transmits data for determination of the variety of parameters to the exposure control processor 210 by carrying out the processes below.

In S311, the lithography control processor 310 evaluates whether or not to change the target value θt of the sidewall angle θ. When not changing the target value θt (NO in S311), the lithography control processor 310 repeats the process in S311 until the target value θt is changed. When changing the target value θt (YES in S311), the lithography control processor 310 proceeds to the process in S312.

Instead, in S311, the lithography control processor 310 may evaluate whether or not to change an exposure condition other than the target value θt, and carry out the process described above in accordance with the result of the evaluation.

In S312, the lithography control processor 310 determines the target value θt of the sidewall angle θ and transmits the determined target value θt to the exposure control processor 210.

Thereafter, in S314, the lithography control processor 310 transmits this table representing the relationship between the variety of parameters including the energy ratio Rλ and the sidewall angle θ to the exposure control processor 210. The lithography control processor 310 may not transmit the entire data stored in the memory 312 to the exposure control processor 210, but may transmit only a table relating to the exposure conditions in the following exposure to the exposure control processor 210.

The exposure control processor 210 can determine the variety of parameters based on the data received from the lithography control processor 310.

After S314, the lithography control processor 310 returns to the process in S311.

As described above, the data for determining the variety of parameters is transmitted to the exposure control processor 210 whenever the target value θt of the sidewall angle θ is changed, or whenever any of the exposure conditions is changed.

In the other respects, the configurations and operations in the third embodiment are the same as those in the first embodiment or the second embodiment.

4.3 Other Configuration Examples

The third embodiment has been described with reference to the case where the lithography control processor 310 updates the table and stores the updated table, but not necessarily in the present disclosure. For example, the exposure control processor 210 may update the table and store the updated table.

4.4 Effects

In the third embodiment, the wafer inspection system 700 measures the sidewall angle θ of the resist film produced by the exposure using the first pulsed laser light and the second pulsed laser light. The lithography control processor 310 updates the data based on the measured sidewall angle θ and the energy ratio Rλ in the exposure at the time of the measurement. The energy ratio Rλ can thus be determined based on the actually measured sidewall angle θ, whereby the sidewall angle θ can be controlled more accurately. Furthermore, since the data can be updated, the accuracy of the control can be further improved.

5. LINE NARROWING APPARATUS THAT SELECTS THREE OR MORE WAVELENGTHS

5.1 Configuration

Figure 23A:
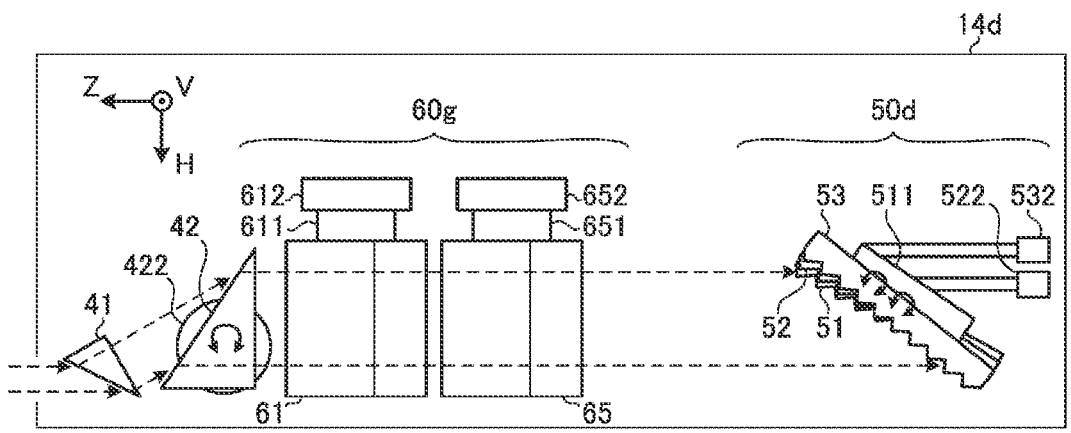
FIGS. 23A to 23C schematically show the configuration of a line narrowing apparatus in a fourth embodiment.
Figure 23B:
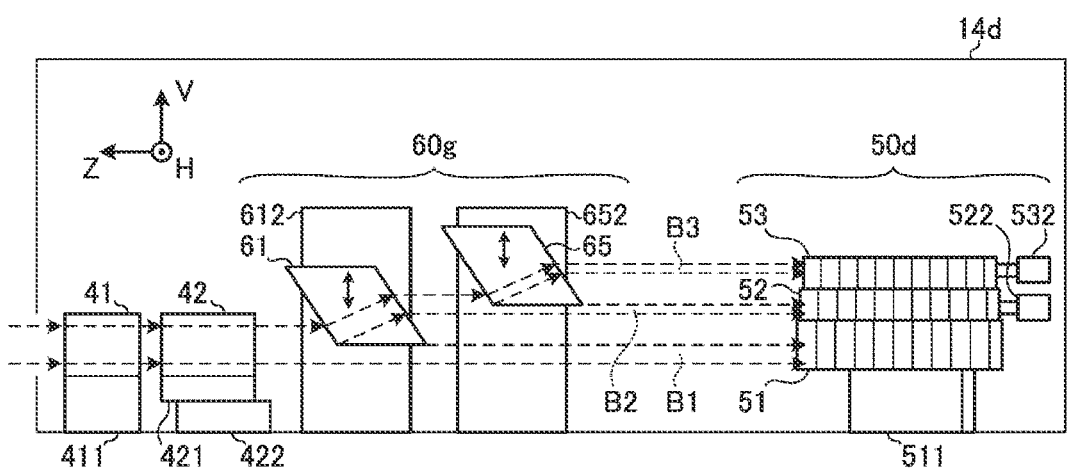
Figure 23C:
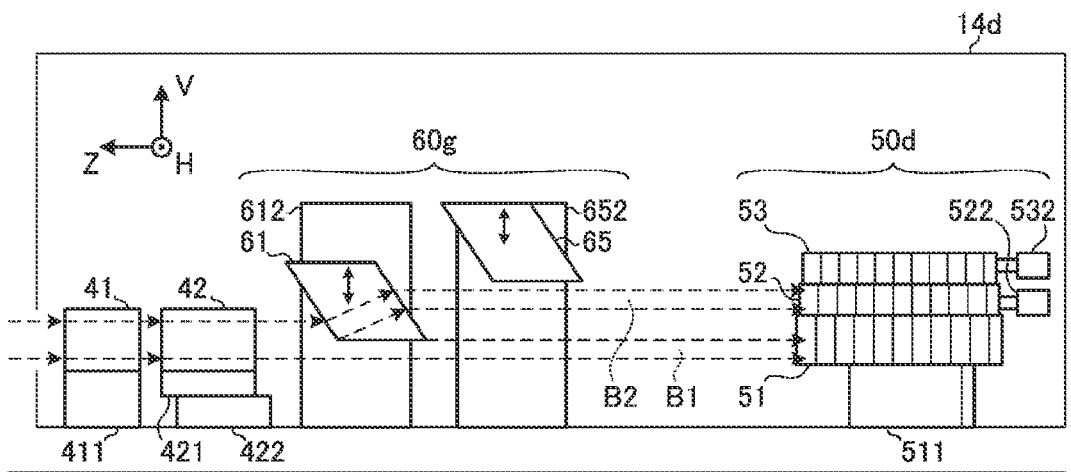

FIGS. 23A to 23C schematically show the configuration of a line narrowing apparatus 14*d* in a fourth embodiment. FIG. 23A shows the line narrowing apparatus 14*d* viewed in the direction −V, and FIGS. 23B and 23C show the line narrowing apparatus 14*d* viewed in the direction −H.

The line narrowing apparatus 14*d* includes a beam separating optical system 60*g*. The beam separating optical system 60*g* includes plane parallel substrates 61 and 65.

The line narrowing apparatus 14*d* includes a grating system 50*d* in place of the grating system 50 (see FIGS. 5A and 5B). The grating system 50*d* includes a grating 53 as well as the gratings 51 and 52.

5.1.1 Plane Parallel Substrates 61 and 65

The configurations of the plane parallel substrate 61, the holder 611, and the linear stage 612 are the same as the corresponding configurations in the first embodiment.

The plane parallel substrate 65 is disposed so as to overlap with part of the cross-section of the optical path of the light beam having passed through the plane parallel substrate 61. The plane parallel substrate 65 is supported by a holder 651. The plane parallel substrate 65 is configured to be movable in the directions −V and +V with the aid of a linear stage 652.

In other respects, the configuration of the plane parallel substrate 65 is the same as the configuration of the plane parallel substrate 61.

5.1.2 Gratings 51 to 53

The configurations of the gratings 51 and 52 and the rotation mechanism 522 are the same as the corresponding configurations in the first embodiment.

The grating 53 is disposed in the optical path of the light beam having passed through the plane parallel substrate 65 so as to be aligned in the direction of the axis V with the gratings 51 and 52. The direction of the grooves of the grating 53 coincides with the direction of the axis V.

The grating 53 is supported by the holder 511. A rotation mechanism 532 allows the grating 53 to rotate around an axis parallel to the axis V.

5.2 Operation of Narrowed-Line Gas Laser Apparatus 100

The first portion B1 of the light beam having passed through the second prism 42 passes through the space outside the plane parallel substrate 61 and is incident on the grating 51. The second portion B2 and a third portion B3 of the light beam pass through the interior of the plane parallel substrate 61. The second portion B2 of the light beam passes through the space outside the plane parallel substrate 65 and is incident on the grating 52. The third portion B3 of the light beam passes through the interior of the plane parallel substrate 65 and is incident on the grating 53. That is, the beam separating optical system 60g causes the first portion B1 of the light beam to be incident on the grating 51, the second portion B2 of the light beam to be incident on the grating 52, and the third portion B3 of the light beam to be incident on the grating 53.

The optical path axis of the second portion B2 of the light beam is shifted in the direction +V from the optical path axis of the first portion B1, and the optical path axis of the third portion B3 of the light beam is shifted further in the direction +V from the optical path axis of the second portion B2. The beam separating optical system 60g thus separates the first portion B1, the second portion B2, and the third portion B3 of the light beam from one another.

The linear stage 652 changes the position of the plane parallel substrate 65 in the direction of the axis V to change the ratio between the energy of the second portion B2 and the energy of the third portion B3.

The linear stage 612 changes the position of the plane parallel substrate 61 in the direction of the axis V to change the ratio between the energy of the first portion B1 and the energy of the sum of the second portion B2 and the third portion B3. As a result, the ratio between the energy of the first portion B1 and the energy of the second portion B2 changes.

The exposure control processor 210 (see FIG. 2) transmits to the laser control processor 130 the target values $\lambda St$, $\lambda Lt$, and $\lambda Mt$ of the first, second, and third wavelengths $\lambda S$, $\lambda L$, and $\lambda M$, and the target value $R\lambda t$ of the energy ratio $R\lambda$ among the energy of the first portion B1, the energy of the second portion B2, and the energy of the third portion B3.

The laser control processor 130 controls the rotary stage 422 based on the target value $\lambda St$ of the first wavelength $\lambda S$, controls the rotation mechanism 522 based on the target value $\lambda Lt$ of the second wavelength $\lambda L$, and also controls the rotation mechanism 532 based on the target value $\lambda Mt$ of the third wavelength $\lambda M$. The rotation mechanism 532 changes the posture of the grating 53 to adjust a third angle of incidence of the third portion B3 of the light beam incident on the grating 53.

The laser control processor 130 controls the linear stages 612 and 652 based on the target value $R\lambda t$ of the energy ratio $R\lambda$ among the energy of the first portion B1, the energy of the second portion B2, and the energy of the third portion B3.

The configurations and operations described above select light beams having the first wavelength $\lambda S$, the second wavelength $\lambda L$, and the third wavelength $\lambda M$ out of the light beam having exited via the window 10a of the laser chamber 10 and cause the selected light beams to return to the laser chamber 10. The narrowed-line gas laser apparatus 100 can thus perform three-wavelength oscillation.

The pulsed laser light outputted from the narrowed-line gas laser apparatus 100 performing the three-wavelength oscillation contains three wavelength components having the first wavelength $\lambda S$, the second wavelength $\lambda L$, and the third wavelength $\lambda M$. The pulsed laser light contains pulses resulting from the situation in which the first pulsed laser light having the first wavelength $\lambda S$, the second pulsed laser light having the second wavelength $\lambda L$, and the third pulsed laser light having the third wavelength $\lambda M$ temporally and spatially coincide with one another. Instead, the first pulsed laser light having the first wavelength $\lambda S$, the second pulsed laser light having the second wavelength $\lambda L$, and the third pulsed laser light having the third wavelength $\lambda M$ may temporally coincide with one another but may not spatially coincide with one another.

The energy of the third portion B3 in the energy ratio may be set at zero by moving the plane parallel substrate 65 out of the optical path of the light beam, as shown in FIG. 23C. That is, the three-wavelength mode may be switched to the two-wavelength mode, in which the light beam is incident on the gratings 51 and 52 but is not incident on the grating 53.

Figure 24A:
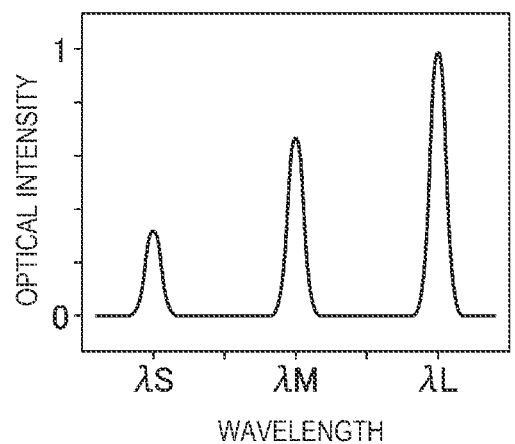
FIG. 24A shows a first example of the spectrum of the pulsed laser light outputted from the narrowed-line gas laser apparatus in the fourth embodiment.
Figure 24B:
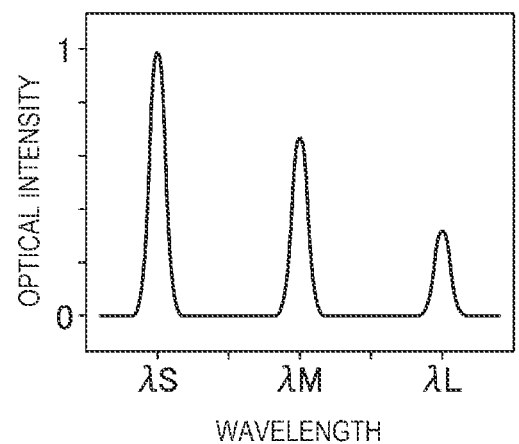
FIG. 24B shows a second example of the spectrum of the pulsed laser light outputted from the narrowed-line gas laser apparatus in the fourth embodiment.

5.3 Relationship Between Energy Ratio $R\lambda$ and Sidewall Angle $\theta$ FIG. 24A shows a first example of the spectrum of the pulsed laser light outputted from the narrowed-line gas laser apparatus 100 in the fourth embodiment. FIG. 24B shows a second example of the spectrum of the pulsed laser light outputted from the narrowed-line gas laser apparatus 100 in the fourth embodiment. In FIGS. 24A and 24B, the spectra of the pulsed laser light each have a peak at the third wavelength $\lambda M$ as well as the peak at the first wavelength $\lambda S$ and the peak at the second wavelength $\lambda L$. The third wavelength $\lambda M$ is assumed to be longer than the first wavelength $\lambda S$ but shorter than the second wavelength $\lambda L$. The third wavelength $\lambda M$ may have the following value:

$$\lambda M = (\lambda S + \lambda L)/2$$

The definition of the energy ratio $R\lambda$ is shown below by way of example.

$$R\lambda = E\lambda S/(E\lambda S + E\lambda M + E\lambda L)$$

where EλM represents the pulse energy of the wavelength component having the third wavelength λM. The energy ratio Rλ corresponds to the first parameter for the energy ratio in the present disclosure. The first parameter is, however, not limited to the energy ratio Rλ. The first parameter may have the following value:

$$R\lambda i = I\lambda S/(I\lambda S + I\lambda M + I\lambda L)$$

where IλM represents a peak value of the optical intensity of the wavelength component having the third wavelength λM.

In the spectrum shown in FIG. 24A, when the ratio among the pulse energy of the wavelength component having the first wavelength λS, the pulse energy of the wavelength component having the third wavelength λM, and the pulse energy of the wavelength component having the second wavelength λL, EλS:EλM:EλL is 1:2:3, the energy ratio Rλ is calculated by the following equation:

$$R\lambda = 1/(1 + 2 + 3)$$
$$= 1/6$$

In the spectrum shown in FIG. 24B, when the ratio among the pulse energy of the wavelength component having the first wavelength λS, the pulse energy of the wavelength component having the third wavelength λM, and the pulse energy of the wavelength component having the second wavelength λL, EλS:EλM:EλL is 3:2:1, the energy ratio Rλ is calculated by the following equation:

$$R\lambda = 3/(3 + 2 + 1)$$
$$= 1/2$$

Figure 25:
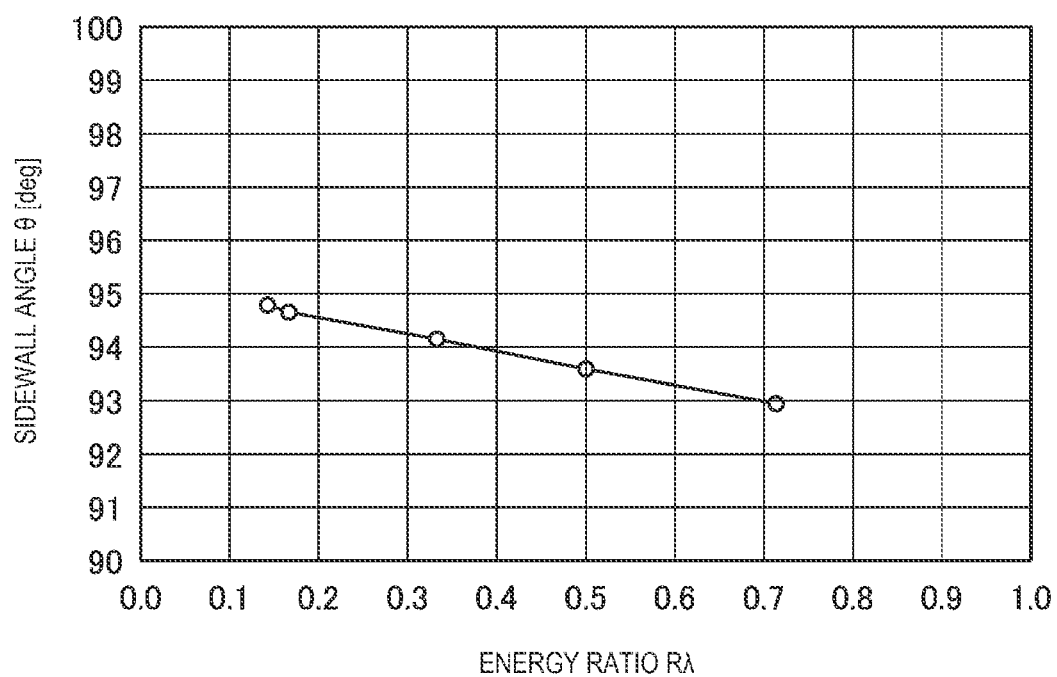
FIG. 25 is a graph showing an example of the relationship of the energy ratio Rλ among the energy of the wavelength component having the first wavelength λS, the energy of the wavelength component having the second wavelength λL, and the energy of a wavelength component having a third wavelength λM with the sidewall angle θ of the resist film.

FIG. 25 is a graph showing an example of the relationship of the energy ratio Rλ among the energy of the wavelength component having the first wavelength λS, the energy of the wavelength component having the second wavelength λL, and the energy of the wavelength component having the third wavelength λM with the sidewall angle θ of the resist film. FIG. 25 shows the relationship indicating that the sidewall angle θ approaches 90° as the energy ratio Rλ increases. That is, the greater the energy ratio Rλ, the more the sidewall Sr of the resist film (see FIGS. 9A to 9C) is close to parallel to the optical path axis of the pulsed laser light.

The relationship between the energy ratio Rλ and the sidewall angle θ is determined in advance by measurement or simulation. Data representing the relationship between the energy ratio Rλ and the sidewall angle θ is stored in the memory 212 in the form of the graph shown in FIG. 25, an approximate expression thereof, or a table. The exposure control processor 210 sets the target value Rλt of the energy ratio Rλ based on the data representing the relationship between the energy ratio Rλ and the sidewall angle θ and the target value θt of the sidewall angle θ.

In FIG. 25, the range over which the value of the sidewall angle θ can be changed by adjusting the energy ratio Rλ is narrower than the range in FIG. 10. Instead, the variation of the sidewall angle θ versus the variation of the energy ratio Rλ is moderate in FIG. 25. The sidewall angle θ can therefore be precisely controlled within the range over which the value of the sidewall angle θ is changeable.

5.4 Operation of Lithography Control Processor 310

Figure 26:
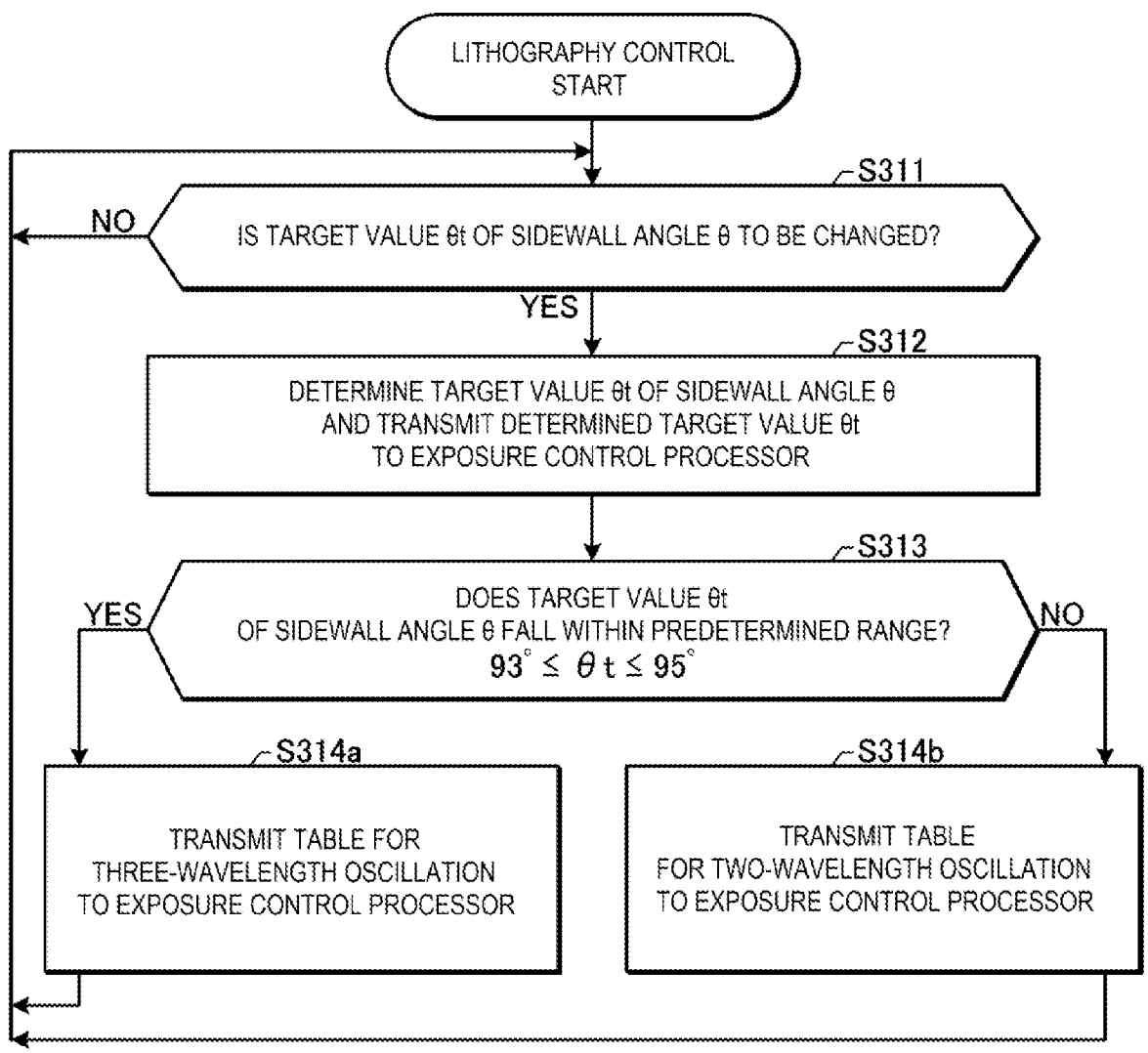
FIG. 26 is a flowchart showing the procedure in accordance with which the lithography control processor performs the lithography control.

FIG. 26 is a flowchart showing the procedure in accordance with which the lithography control processor 310 performs the lithography control. The processes shown in FIG. 26 include the process of selecting one of the two-wavelength oscillation and the three-wavelength oscillation. The lithography control processor 310 transmits data for determination of the variety of parameters to the exposure control processor 210 by carrying out the processes below.

In S311, the lithography control processor 310 evaluates whether or not to change the target value θt of the sidewall angle θ.

In S312, the lithography control processor 310 determines the target value θt of the sidewall angle θ and transmits the determined target value θt to the exposure control processor 210.

The processes in steps S311 and S312 are the same as those described with reference to FIG. 22.

Thereafter, in S313, the lithography control processor 310 evaluates whether or not the target value θt of the sidewall angle θ falls within a predetermined range. Specifically, the lithography control processor 310 evaluates whether or not the target value θt falls with the following range:

$$93° <= \theta t <= 95°.$$

The lithography control processor 310 makes the following selection based on the result of the evaluation:

When the target value θt falls within the predetermined range described above (YES in S313), the sidewall angle θ can be precisely controlled by adjusting the energy ratio among the energies of the wavelength components having the three wavelengths based on the relationship shown in FIG. 25. The lithography control processor 310 then proceeds to the process in S314a.

When the target value θt does not fall within the predetermined range described above (NO in S313), the sidewall angle θ can be controlled by adjusting the energy ratio between the energies of the wavelength components having the two wavelengths based on the relationship shown in FIG. 10. The lithography control processor 310 then proceeds to the process in S314b.

In S314a, the lithography control processor 310 transmits a table representing the relationship between the variety of parameters including the energy ratio Rλ among the energies of the wavelength components having the three wavelengths and the sidewall angle θ to the exposure control processor 210. In this case, the exposure control processor 210 transmits the target value Rλt of the energy ratio Rλ among the energies of the wavelength components having the three wavelengths to the laser control processor 130. The laser control processor 130 controls the narrowed-line gas laser apparatus 100 so as to perform the three-wavelength oscillation.

In S314b, the lithography control processor 310 transmits a table representing the relationship between the variety of parameters including the energy ratio Rλ between the energies of the wavelength components having the two wavelengths and the sidewall angle θ to the exposure control processor 210. In this case, the exposure control processor 210 transmits the target value Rλt of the energy ratio Rλ between the energies of the wavelength components having the two wavelengths to the laser control processor 130. The laser control processor 130 controls the narrowed-line gas laser apparatus 100 so as to perform the two-wavelength oscillation.

After S314a or S314b, the lithography control processor 310 returns to the process in S311.

As described above, the two-wavelength oscillation or the three-wavelength oscillation is performed whenever the target value θt of the sidewall angle θ is changed, or whenever any of the exposure conditions is changed, and data for determining the variety of parameters is transmitted to the exposure control processor 210.

In the other respects, the configurations and operations in the fourth embodiment are the same as those in the third embodiment.

5.5 Other Configuration Examples

In the fourth embodiment, the three-wavelength oscillation or the two-wavelength oscillation can be selected, but not necessarily in the present disclosure. In addition to the gratings 51 to 53, extra gratings may be arranged in the direction of the axis V to allow the laser oscillation at four or more wavelengths.

The fourth embodiment has been described with reference to the case where the line narrowing apparatus 14d including the three gratings 51 to 53 is used to perform the three-wavelength oscillation, but not necessarily in the present disclosure. The wavelength of the pulsed laser light may be periodically switched to one of the first wavelength λS, the second wavelength λL, and the third wavelength λM by switching the posture of the first prism 41 every N pulses, which form one cycle.

5.6 Effects

The fourth embodiment allows adjustment of the energy ratio Rλ among the energy of the first pulsed laser light having the first wavelength λS, the energy of the second pulsed laser light having the second wavelength λL, and the energy of the third pulsed laser light having the third wavelength λM, which is longer than the first wavelength λS but shorter than the second wavelength λL. The sidewall angle θ of the resist film can be controlled by exposing the resist film to the first to third pulsed laser light.

According to the fourth embodiment, the lithography control processor 310 evaluates whether or not the target value θt of the sidewall angle θ falls within the predetermined range. Based on the result of the evaluation, the lithography control processor 310 selects whether to expose the resist film to the first to third pulsed laser light or two of the first to third pulsed laser light. The lithography control processor 310 can therefore select whether to precisely control the sidewall angle θ by adjusting the energy ratio Rλ among the energies of the wavelength components having the three wavelengths, or to control the sidewall angle θ over a wide range by adjusting the energy ratio Rλ between the energies of the wavelength components having the two wavelengths.

6. OTHERS

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An exposure method comprising:
    setting a first target wavelength and a second target wavelength longer than the first target wavelength;
    reading data representing a relationship between an energy ratio and a sidewall angle, wherein the energy ratio includes a ratio of energy of the first pulsed laser light outputted according to the first target wavelength and energy of the second pulsed laser light outputted according to the second target wavelength and the sidewall angle of a resist film is an angle of a sidewall produced when the resist film is exposed to the first pulsed laser light and the second pulsed laser light;
    determining a target value of the energy ratio based on the data and a target value of the sidewall angle; and
    exposing the resist film to the first pulsed laser light and the second pulsed laser light by controlling a narrowed-line gas laser apparatus to output the first pulsed laser light and the second pulsed laser light based on the target value of the energy ratio.

2. The exposure method according to claim 1,
    wherein the data includes a relationship showing that the greater a ratio of pulse energy of the first pulsed laser light to a sum of the pulse energy of the first pulsed laser light and pulse energy of the second pulsed laser light, the more the sidewall of the resist film is close to parallel to an optical path axis of either the first pulsed laser light or the second pulsed laser light.

3. The exposure method according to claim 1,
    wherein the resist film is irradiated with the first pulsed laser light and the second pulsed laser light in a form of temporally overlapping pulses.

4. The exposure method according to claim 1,
    wherein the resist film is irradiated with the first pulsed laser light and the second pulsed laser light periodically switched from one to the other every set number of pulses.

5. The exposure method according to claim 4,
    wherein the number of pulses of the first pulsed laser light and the number of pulses of the second pulsed laser light out of the set number of pulses are determined based on the target value of the energy ratio.

6. The exposure method according to claim 4,
    wherein the total number of pulses of the first pulsed laser light and the second pulsed laser light radiated to one location on the resist films is a multiple of the set number of pulses.

7. The exposure method according to claim 1,
    wherein the sidewall angle of the resist film is measured; and
    the data is updated based on the measured sidewall angle and the energy ratio in the exposure of the resist film.

8. The exposure method according to claim 1, further comprising:
setting a third target wavelength longer than the first target wavelength but shorter than the second target wavelength,
wherein the energy ratio is a ratio among the energy of the first pulsed laser light, the energy of the second pulsed laser light, and energy of third pulsed laser light outputted according to the third target wavelength,
the sidewall angle of the resist film is the angle of the sidewall produced when the resist film is exposed to the first to third pulsed laser light, and
the resist film is exposed to the first to third pulsed laser light based on the target value of the energy ratio.

9. The exposure method according to claim 8,
wherein it is evaluated whether or not the target value of the sidewall angle falls within a predetermined range, and
whether the resist film is exposed to the first to third pulsed laser light, or
whether the resist film is exposed to two of the first to third pulsed laser light
is selected based on a result of the evaluation, and the resist film is exposed to the selected pulsed laser light.

10. An exposure system comprising:
a processor configured to set a first target wavelength and a second target wavelength longer than the first target wavelength, read data representing a relationship between an energy ratio and a sidewall angle, wherein the energy ratio includes a ratio of energy of the first pulsed laser light outputted according to the first target wavelength and energy of the second pulsed laser light outputted according to the second target wavelength and the sidewall angle of a resist film is an angle of a sidewall produced when the resist film is exposed to the first pulsed laser light and the second pulsed laser light, and determine a target value of the energy ratio based on the data and a target value of the sidewall angle;
a narrowed-line gas laser apparatus configured to output the first pulsed laser light and the second pulsed laser light based on the target value of the energy ratio; and
an exposure apparatus configured to expose the resist film to the first pulsed laser light and the second pulsed laser light outputted from the narrowed-line gas laser apparatus.

11. The exposure system according to claim 10,
wherein the data includes a relationship showing that the greater a ratio of pulse energy of the first pulsed laser light to a sum of the pulse energy of the first pulsed laser light and pulse energy of the second pulsed laser light, the more the sidewall of the resist film is close to parallel to an optical path axis of either the first pulsed laser light or the second pulsed laser light.

12. The exposure system according to claim 10,
wherein the narrowed-line gas laser apparatus is configured to output the first pulsed laser light and the second pulsed laser light in a form of temporally overlapping pulses.

13. The exposure system according to claim 10,
wherein the narrowed-line gas laser apparatus is configured to output the first pulsed laser light and the second pulsed laser light periodically switched from one to the other every set number of pulses.

14. The exposure system according to claim 13,
wherein the processor determines the number of pulses of the first pulsed laser light and the number of pulses of the second pulsed laser light out of the set number of pulses based on the target value of the energy ratio.

15. The exposure system according to claim 13,
wherein the total number of pulses of the first pulsed laser light and the second pulsed laser light radiated to one location on the resist films is a multiple of the set number of pulses.

16. The exposure system according to claim 10,
further comprising a wafer inspection system configured to measure the sidewall angle of the resist film,
wherein the processor updates the data based on the measured sidewall angle and the energy ratio in the exposure of the resist film.

17. The exposure system according to claim 10,
wherein the processor
receives the sidewall angle of the resist film from the wafer inspection system,
receives the energy ratio in the exposure of the resist film from one of the exposure apparatus and the narrowed-line gas laser apparatus, and
updates the data based on the received sidewall angle and the energy ratio in the exposure of the resist film.

18. The exposure system according to claim 10,
wherein the processor sets a third target wavelength longer than the first target wavelength but shorter than the second target wavelength, the energy ratio is a ratio among the energy of the first pulsed laser light, the energy of the second pulsed laser light, and energy of third pulsed laser light outputted according to the third target wavelength,
the sidewall angle of the resist film is the angle of the sidewall produced when the resist film is exposed to the first to third pulsed laser light, and
the exposure apparatus exposes the resist film to the first to third pulsed laser light based on the target value of the energy ratio.

19. The exposure system according to claim 18,
wherein the processor
evaluates whether or not the target value of the sidewall angle falls within a predetermined range, and
selects whether the resist film is exposed to the first to third pulsed laser light, or
whether the resist film is exposed to two of the first to third pulsed laser light based on a result of the evaluation, and
the exposure apparatus exposes the resist film to the selected pulsed laser light.

20. A method for manufacturing electronic devices, the method comprising:
setting a first target wavelength and a second target wavelength longer than the first target wavelength;
reading data representing a relationship between an energy ratio and a sidewall angle, wherein the energy ratio includes a ratio of energy of the first pulsed laser light outputted according to the first target wavelength and energy of the second pulsed laser light outputted according to the second target wavelength and the sidewall angle of a resist film is an angle of a sidewall produced when the resist film is exposed to the first pulsed laser light and the second pulsed laser light;
determining a target value of the energy ratio based on the data and a target value of the sidewall angle;
controlling a narrowed-line gas laser apparatus to output the first pulsed laser light and the second pulsed laser light to an exposure apparatus based on the target value of the energy ratio; and exposing the resist film to the first pulsed laser light and the second pulsed laser light in the exposure apparatus to manufacture the electronic devices.

\* \* \* \* \*